(12) United States Patent
Cok

(10) Patent No.: US 11,064,609 B2
(45) Date of Patent: Jul. 13, 2021

(54) PRINTABLE 3D ELECTRONIC STRUCTURE

(71) Applicant: X Display Company Technology Limited, Dublin (IE)

(72) Inventor: Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 15/668,460

(22) Filed: Aug. 3, 2017

(65) Prior Publication Data

US 2018/0042110 A1  Feb. 8, 2018

Related U.S. Application Data

(60) Provisional application No. 62/371,008, filed on Aug. 4, 2016.

(51) Int. Cl.
*H01G 4/33* (2006.01)
*H01G 4/38* (2006.01)
(Continued)

(52) U.S. Cl.
CPC ............. *H05K 1/18* (2013.01); *H01L 21/481* (2013.01); *H01L 21/4853* (2013.01);
(Continued)

(58) Field of Classification Search
CPC ........... H05K 1/18; H01L 25/16; H01L 24/02; H01L 21/4853; H01L 21/481; H01L 23/49833; H01L 23/49811; H01L 23/3114
See application file for complete search history.

(56) References Cited

U.S. PATENT DOCUMENTS 4,934,267 A  6/1990 Hashimoto et al.
5,388,577 A  2/1995 Hubbard
(Continued)

FOREIGN PATENT DOCUMENTS

EP  0281100 B1  6/1992
JP  2005 099410 A  4/2005
(Continued)

OTHER PUBLICATIONS

Bower, C. A. et al., Transfer Printing: An Approach for Massively Parallel Assembly of Microscale Devices, IEE, Electronic Components and Technology Conference, (2008).
(Continued)

*Primary Examiner* — Nathan Milakovich
(74) *Attorney, Agent, or Firm* — Choate, Hall & Stewart LLP; William R. Haulbrook; Michael D. Schmitt

(57) ABSTRACT

A printable electronic component includes a component substrate and a circuit disposed in or on the component substrate. One or more electrically conductive connection posts protrude from the component substrate. One or more electrically conductive component contact pads are exposed on or over the component substrate on a side of the component substrate opposite the one or more connection posts. The one or more component contact pads and the one or more electrically conductive connection posts are both electrically connected to the circuit. The components can be printed onto a destination substrate and electrically connected to contact pads on the destination substrate through the connection posts. The components can also be printed onto other components and electrically connected through the connection posts and component contact pads to form a three-dimensional electronic structure.

23 Claims, 30 Drawing Sheets

(51) Int. Cl.

| | | |
|---|---|---|
| *H01L 21/48* | (2006.01) | |
| *H01L 21/683* | (2006.01) | |
| *H01L 23/00* | (2006.01) | |
| *H01L 23/13* | (2006.01) | |
| *H01L 23/31* | (2006.01) | |
| *H01L 23/498* | (2006.01) | |
| *H01L 25/10* | (2006.01) | |
| *H01L 25/16* | (2006.01) | |
| *H05K 1/14* | (2006.01) | |
| *H05K 1/16* | (2006.01) | |
| *H05K 1/18* | (2006.01) | |
| *H05K 3/40* | (2006.01) | |
| *H05K 3/46* | (2006.01) | |

(52) U.S. Cl.
CPC ...... *H01L 21/4867* (2013.01); *H01L 21/6835* (2013.01); *H01L 23/13* (2013.01); *H01L 23/3114* (2013.01); *H01L 23/49811* (2013.01); *H01L 23/49833* (2013.01); *H01L 24/02* (2013.01); *H01L 25/105* (2013.01); *H01L 25/16* (2013.01); *H05K 1/141* (2013.01); *H05K 3/4007* (2013.01); *H01G 4/33* (2013.01); *H01G 4/38* (2013.01); *H01L 2221/68318* (2013.01); *H01L 2221/68345* (2013.01); *H01L 2221/68359* (2013.01); *H01L 2224/02311* (2013.01); *H01L 2224/02371* (2013.01); *H01L 2224/02381* (2013.01); *H01L 2225/1035* (2013.01); *H01L 2225/1076* (2013.01); *H05K 1/144* (2013.01); *H05K 1/162* (2013.01); *H05K 3/4682* (2013.01); *H05K 2201/0367* (2013.01); *H05K 2201/045* (2013.01); *H05K 2201/09672* (2013.01); *H05K 2201/1053* (2013.01); *H05K 2201/10166* (2013.01); *H05K 2201/10515* (2013.01); *H05K 2201/10522* (2013.01); *H05K 2201/2072* (2013.01); *H05K 2203/0165* (2013.01); *H05K 2203/0278* (2013.01); *H05K 2203/302* (2013.01); *H05K 2203/308* (2013.01)

(56) References Cited

U.S. PATENT DOCUMENTS

| | | | |
|---|---|---|---|
| 5,550,066 A | | 8/1996 | Tang et al. |
| 5,557,149 A | | 9/1996 | Richards et al. |
| 5,621,555 A | | 4/1997 | Park |
| 5,815,303 A | | 9/1998 | Berlin |
| 5,929,521 A | | 7/1999 | Wark et al. |
| 6,025,730 A | | 2/2000 | Akram et al. |
| 6,051,489 A | | 4/2000 | Young et al. |
| 6,051,878 A | * | 4/2000 | Akram .................. H05K 1/144 257/678 |
| 6,114,221 A | | 9/2000 | Tonti et al. |
| 6,142,358 A | | 11/2000 | Cohn et al. |
| 6,180,239 B1 | | 1/2001 | Whitesides et al. |
| 6,277,669 B1 | | 8/2001 | Kung et al. |
| 6,278,242 B1 | | 8/2001 | Cok et al. |
| 6,400,021 B1 | | 6/2002 | Cho |
| 6,448,108 B1 | | 9/2002 | Lin |
| 6,544,813 B1 | | 4/2003 | Lin |
| 6,555,408 B1 | | 4/2003 | Jacobsen et al. |
| 6,577,367 B2 | | 6/2003 | Kim |
| 6,717,263 B2 | | 4/2004 | Sawai et al. |
| 6,717,560 B2 | | 4/2004 | Cok et al. |
| 6,756,576 B1 | | 6/2004 | McElroy et al. |
| 6,781,224 B2 | | 8/2004 | Yoneda et al. |
| 6,841,853 B2 | | 1/2005 | Yamada |
| 6,933,532 B2 | | 8/2005 | Arnold et al. |
| 6,964,881 B2 | | 11/2005 | Chua et al. |
| 6,969,624 B2 | | 11/2005 | Iwafuchi et al. |
| 6,974,711 B2 | | 12/2005 | Yanagisawa et al. |
| 6,998,644 B1 | | 2/2006 | Boling et al. |
| 7,109,063 B2 | | 9/2006 | Jiang |
| 7,115,495 B2 | | 10/2006 | Wark et al. |
| 7,127,810 B2 | | 10/2006 | Kasuga et al. |
| 7,129,457 B2 | | 10/2006 | McElroy et al. |
| 7,195,733 B2 | | 3/2007 | Rogers et al. |
| 7,259,391 B2 | | 8/2007 | Liu et al. |
| 7,288,753 B2 | | 10/2007 | Cok |
| 7,380,007 B1 | | 5/2008 | Bu et al. |
| 7,453,157 B2 | | 11/2008 | Haba et al. |
| 7,491,893 B2 | | 2/2009 | Takesue |
| 7,521,292 B2 | | 4/2009 | Rogers et al. |
| 7,534,652 B2 | | 5/2009 | Haba et al. |
| 7,557,367 B2 | | 7/2009 | Rogers et al. |
| 7,586,497 B2 | | 9/2009 | Boroson et al. |
| 7,591,921 B2 | | 9/2009 | Fukui et al. |
| 7,605,053 B2 | | 10/2009 | Couillard et al. |
| 7,622,367 B1 | | 11/2009 | Nuzzo et al. |
| 7,635,611 B2 | | 12/2009 | Jiang |
| 7,662,545 B2 | | 2/2010 | Nuzzo et al. |
| 7,667,335 B2 | | 2/2010 | Lin et al. |
| 7,691,656 B2 | | 4/2010 | Bader et al. |
| 7,704,684 B2 | | 4/2010 | Rogers et al. |
| 7,749,887 B2 | | 7/2010 | Lee |
| 7,799,699 B2 | | 9/2010 | Nuzzo et al. |
| 7,816,856 B2 | | 10/2010 | Cok et al. |
| 7,893,533 B2 | | 2/2011 | Saito |
| 7,893,612 B2 | | 2/2011 | Cok |
| 7,927,976 B2 | | 4/2011 | Menard |
| 7,932,123 B2 | | 4/2011 | Rogers et al. |
| 7,943,491 B2 | | 5/2011 | Nuzzo et al. |
| 7,972,875 B2 | | 7/2011 | Rogers et al. |
| 7,977,789 B2 | | 7/2011 | Park |
| 7,982,296 B2 | | 7/2011 | Nuzzo et al. |
| 7,999,454 B2 | | 8/2011 | Winters et al. |
| 8,008,182 B2 | | 8/2011 | Asakawa |
| 8,029,139 B2 | | 10/2011 | Ellinger et al. |
| 8,035,226 B1 | | 10/2011 | Wilcoxen et al. |
| 8,039,847 B2 | | 10/2011 | Nuzzo et al. |
| 8,110,425 B2 | | 2/2012 | Yun |
| 8,198,621 B2 | | 6/2012 | Rogers et al. |
| 8,207,547 B2 | | 6/2012 | Lin |
| 8,261,660 B2 | | 9/2012 | Menard |
| 8,334,545 B2 | | 12/2012 | Levermore et al. |
| 8,394,706 B2 | | 3/2013 | Nuzzo et al. |
| 8,440,546 B2 | | 5/2013 | Nuzzo et al. |
| 8,449,285 B2 | | 5/2013 | McGeehan |
| 8,470,701 B2 | | 6/2013 | Rogers et al. |
| 8,502,192 B2 | | 8/2013 | Kwak et al. |
| 8,506,867 B2 | | 8/2013 | Menard |
| 8,558,243 B2 | | 10/2013 | Bibl et al. |
| 8,664,699 B2 | | 3/2014 | Nuzzo et al. |
| 8,669,173 B2 | | 3/2014 | Lee |
| 8,685,764 B2 | | 4/2014 | Chu et al. |
| 8,686,447 B2 | | 4/2014 | Tomoda et al. |
| 8,722,458 B2 | | 5/2014 | Rogers et al. |
| 8,754,396 B2 | | 6/2014 | Rogers et al. |
| 8,766,970 B2 | | 7/2014 | Chien et al. |
| 8,791,474 B1 | | 7/2014 | Bibl et al. |
| 8,794,501 B2 | | 8/2014 | Bibl et al. |
| 8,803,857 B2 | | 8/2014 | Cok |
| 8,809,672 B2 | | 8/2014 | Chuang et al. |
| 8,817,369 B2 | | 8/2014 | Daiku |
| 8,835,940 B2 | | 9/2014 | Hu et al. |
| 8,854,294 B2 | | 10/2014 | Sakariya |
| 8,865,489 B2 | | 10/2014 | Rogers et al. |
| 8,871,547 B2 | | 10/2014 | Chu et al. |
| 8,877,648 B2 | | 11/2014 | Bower et al. |
| 8,889,485 B2 | | 11/2014 | Bower |
| 8,890,315 B2 | | 11/2014 | Choi et al. |
| 8,895,406 B2 | | 11/2014 | Rogers et al. |
| 8,934,259 B2 | | 1/2015 | Bower et al. |
| 8,963,326 B2 | | 2/2015 | Bao et al. |
| 8,987,765 B2 | | 3/2015 | Bibl et al. |
| 9,082,910 B2 | | 7/2015 | Lee et al. |
| 9,139,425 B2 | | 9/2015 | Vestyck |
| 9,153,171 B2 | | 10/2015 | Sakariya et al. |
| 9,161,448 B2 | | 10/2015 | Menard et al. |
| 9,214,410 B2 | | 12/2015 | Kim et al. |

(56) References Cited

U.S. PATENT DOCUMENTS

| | | | |
|---|---|---|---|
| 9,219,016 B2 * | 12/2015 | Lin | H01L 22/32 |
| 9,224,680 B2 | 12/2015 | Chen et al. | |
| 9,238,309 B2 | 1/2016 | King et al. | |
| 9,252,094 B2 | 2/2016 | Choi et al. | |
| 9,307,652 B2 | 4/2016 | Bower | |
| 9,358,775 B2 | 6/2016 | Bower et al. | |
| 9,367,094 B2 | 6/2016 | Bibl et al. | |
| 9,368,683 B1 | 6/2016 | Meitl et al. | |
| 9,391,040 B2 | 7/2016 | Dang et al. | |
| 9,401,344 B2 | 7/2016 | Bower et al. | |
| 9,478,583 B2 | 10/2016 | Hu et al. | |
| 9,484,504 B2 | 11/2016 | Bibl et al. | |
| 9,508,666 B2 | 11/2016 | Yu et al. | |
| 9,520,537 B2 | 12/2016 | Bower et al. | |
| 9,550,353 B2 | 1/2017 | Bower et al. | |
| 9,555,644 B2 | 1/2017 | Rogers et al. | |
| 9,583,533 B2 | 2/2017 | Hu et al. | |
| 9,640,715 B2 | 5/2017 | Bower et al. | |
| 9,704,821 B2 | 7/2017 | Meitl et al. | |
| 9,716,082 B2 | 7/2017 | Bower et al. | |
| 9,761,754 B2 | 9/2017 | Bower et al. | |
| 9,765,934 B2 | 9/2017 | Rogers et al. | |
| 9,929,053 B2 | 3/2018 | Bower et al. | |
| 10,037,985 B2 * | 7/2018 | De Winter | H01L 27/0207 |
| 10,103,069 B2 | 10/2018 | Bower et al. | |
| 10,153,256 B2 * | 12/2018 | Cok | H01L 25/165 |
| 10,223,962 B2 * | 3/2019 | Meitl | G09G 3/32 |
| 10,468,391 B2 * | 11/2019 | Cok | H01L 25/167 |
| 10,475,876 B2 * | 11/2019 | Bower | H01L 27/14636 |
| 10,750,614 B2 | 8/2020 | Haba et al. | |
| 2001/0003296 A1 | 6/2001 | Morimoto et al. | |
| 2001/0033030 A1 | 10/2001 | Leedy | |
| 2001/0040298 A1 | 11/2001 | Baba et al. | |
| 2002/0050220 A1 | 5/2002 | Schueller et al. | |
| 2003/0017712 A1 | 1/2003 | Brendel | |
| 2003/0027083 A1 | 2/2003 | Fuller et al. | |
| 2003/0117369 A1 | 6/2003 | Spitzer et al. | |
| 2003/0160325 A1 * | 8/2003 | Yoneda | H01L 21/4846 |
| | | | 257/758 |
| 2003/0183947 A1 | 10/2003 | Ohuchi | |
| 2004/0043533 A1 | 3/2004 | Chua et al. | |
| 2004/0192041 A1 | 9/2004 | Jeong et al. | |
| 2004/0259290 A1 | 12/2004 | Brintzinger et al. | |
| 2005/0181655 A1 | 8/2005 | Haba et al. | |
| 2005/0202595 A1 | 9/2005 | Yonehara et al. | |
| 2005/0224560 A1 | 10/2005 | Takesue | |
| 2005/0285246 A1 | 12/2005 | Haba et al. | |
| 2006/0051900 A1 | 3/2006 | Shizuno | |
| 2006/0063309 A1 | 3/2006 | Sugiyama et al. | |
| 2007/0018321 A1 | 1/2007 | Hiatt et al. | |
| 2007/0075423 A1 | 4/2007 | Ke et al. | |
| 2007/0080464 A1 | 4/2007 | Goebel et al. | |
| 2007/0085102 A1 | 4/2007 | Orita | |
| 2007/0088906 A1 | 4/2007 | Mizushima et al. | |
| 2007/0120268 A1 | 5/2007 | Irsigler et al. | |
| 2007/0145550 A1 | 6/2007 | Haba et al. | |
| 2008/0067663 A1 | 3/2008 | Kang et al. | |
| 2008/0111146 A1 | 5/2008 | Nakamura et al. | |
| 2008/0131822 A1 | 6/2008 | Liao et al. | |
| 2008/0150121 A1 | 6/2008 | Oganesian et al. | |
| 2008/0164575 A1 | 7/2008 | Ikeda et al. | |
| 2008/0185705 A1 | 8/2008 | Osborn et al. | |
| 2008/0202365 A1 | 8/2008 | Schneider et al. | |
| 2009/0014205 A1 | 1/2009 | Kobayashi et al. | |
| 2009/0020870 A1 | 1/2009 | Watanabe et al. | |
| 2009/0065773 A1 | 3/2009 | Ishikawa et al. | |
| 2009/0133914 A1 | 5/2009 | Dellmann et al. | |
| 2009/0146303 A1 | 6/2009 | Kwon | |
| 2009/0229861 A1 | 9/2009 | Hando et al. | |
| 2009/0301771 A1 | 12/2009 | Ochi et al. | |
| 2010/0006876 A1 | 1/2010 | Moteki et al. | |
| 2010/0044826 A1 | 2/2010 | Farooq et al. | |
| 2010/0062098 A1 | 3/2010 | Ando et al. | |
| 2010/0096175 A1 | 4/2010 | Ishimatsu et al. | |
| 2010/0123134 A1 | 5/2010 | Nagata | |
| 2010/0147567 A1 | 6/2010 | Hino et al. | |
| 2010/0155989 A1 | 6/2010 | Ishii et al. | |
| 2010/0190293 A1 | 7/2010 | Maeda et al. | |
| 2010/0265440 A1 | 10/2010 | French et al. | |
| 2010/0289115 A1 | 11/2010 | Akiyama et al. | |
| 2010/0308008 A1 | 12/2010 | Zhu et al. | |
| 2011/0140271 A1 | 6/2011 | Daubenspeck et al. | |
| 2011/0182805 A1 | 7/2011 | DeSimone et al. | |
| 2011/0215466 A1 | 9/2011 | Hsu et al. | |
| 2011/0219973 A1 | 9/2011 | Gullentops et al. | |
| 2011/0266670 A1 | 11/2011 | England et al. | |
| 2012/0000379 A1 | 1/2012 | Greener et al. | |
| 2012/0043130 A1 | 2/2012 | Rathburn | |
| 2012/0074532 A1 | 3/2012 | Shih et al. | |
| 2012/0104624 A1 | 5/2012 | Choi et al. | |
| 2012/0118939 A1 | 5/2012 | Kusanagi et al. | |
| 2012/0126229 A1 | 5/2012 | Bower | |
| 2012/0168776 A1 | 7/2012 | Nakamura et al. | |
| 2012/0206421 A1 | 8/2012 | Cok et al. | |
| 2012/0228669 A1 | 9/2012 | Bower et al. | |
| 2012/0242638 A1 | 9/2012 | Zhong et al. | |
| 2012/0256346 A1 | 10/2012 | Ogino et al. | |
| 2012/0281379 A1 | 11/2012 | Shimada | |
| 2012/0306073 A1 | 12/2012 | Yu et al. | |
| 2012/0313207 A1 | 12/2012 | Oganesian | |
| 2012/0313241 A1 * | 12/2012 | Bower | H01L 21/563 |
| | | | 257/737 |
| 2012/0321738 A1 | 12/2012 | Ishii et al. | |
| 2012/0328728 A1 | 12/2012 | Nakatsuka et al. | |
| 2013/0068720 A1 | 3/2013 | Taniguchi | |
| 2013/0069275 A1 | 3/2013 | Menard et al. | |
| 2013/0077272 A1 | 3/2013 | Lin et al. | |
| 2013/0078576 A1 | 3/2013 | Wu et al. | |
| 2013/0088416 A1 | 4/2013 | Smith et al. | |
| 2013/0119536 A1 | 5/2013 | Hada et al. | |
| 2013/0196474 A1 | 8/2013 | Meitl et al. | |
| 2013/0207964 A1 | 8/2013 | Fleck et al. | |
| 2013/0221355 A1 | 8/2013 | Bower et al. | |
| 2013/0228897 A1 | 9/2013 | Chen et al. | |
| 2013/0273695 A1 | 10/2013 | Menard et al. | |
| 2013/0293292 A1 | 11/2013 | Droege et al. | |
| 2013/0313704 A1 * | 11/2013 | Souriau | H01L 24/13 |
| | | | 257/737 |
| 2013/0333094 A1 | 12/2013 | Rogers et al. | |
| 2013/0337608 A1 | 12/2013 | Kotani et al. | |
| 2014/0015124 A1 | 1/2014 | Fay et al. | |
| 2014/0084450 A1 | 3/2014 | Nielson et al. | |
| 2014/0084482 A1 | 3/2014 | Hu et al. | |
| 2014/0094878 A1 | 4/2014 | Gossler et al. | |
| 2014/0104243 A1 | 4/2014 | Sakariya et al. | |
| 2014/0159043 A1 | 6/2014 | Sakariya et al. | |
| 2014/0159064 A1 | 6/2014 | Sakariya et al. | |
| 2014/0159065 A1 | 6/2014 | Hu et al. | |
| 2014/0159066 A1 | 6/2014 | Hu et al. | |
| 2014/0182912 A1 | 7/2014 | Lin et al. | |
| 2014/0252604 A1 | 9/2014 | Motoyoshi | |
| 2014/0264763 A1 | 9/2014 | Meitl et al. | |
| 2014/0267683 A1 | 9/2014 | Bibl et al. | |
| 2014/0327132 A1 | 11/2014 | Zhang et al. | |
| 2014/0340900 A1 | 11/2014 | Bathurst et al. | |
| 2014/0367633 A1 | 12/2014 | Bibl et al. | |
| 2015/0028473 A1 | 1/2015 | Kim et al. | |
| 2015/0102807 A1 | 4/2015 | Eckinger et al. | |
| 2015/0113195 A1 * | 4/2015 | Kim | G06F 13/4027 |
| | | | 710/308 |
| 2015/0137153 A1 | 5/2015 | Bibl et al. | |
| 2015/0318328 A1 | 11/2015 | Bibl et al. | |
| 2015/0348926 A1 | 12/2015 | Bower | |
| 2015/0371874 A1 | 12/2015 | Bower et al. | |
| 2016/0018094 A1 | 1/2016 | Bower et al. | |
| 2016/0020120 A1 | 1/2016 | Bower et al. | |
| 2016/0020127 A1 | 1/2016 | Bower et al. | |
| 2016/0020131 A1 | 1/2016 | Bower et al. | |
| 2016/0020187 A1 | 1/2016 | Okada et al. | |
| 2016/0056223 A1 | 2/2016 | Bower et al. | |
| 2016/0093600 A1 | 3/2016 | Bower et al. | |
| 2016/0111387 A1 * | 4/2016 | Dang | H01L 24/17 |
| | | | 257/737 |
| 2016/0262268 A1 | 9/2016 | Co et al. | |

(56) References Cited

U.S. PATENT DOCUMENTS

| | | | |
|---|---|---|---|
| 2017/0047303 A1 | 2/2017 | Meitl et al. | |
| 2017/0048976 A1 | 2/2017 | Prevatte et al. | |
| 2017/0154819 A1 | 6/2017 | Bower et al. | |
| 2017/0213803 A1 | 7/2017 | Bower | |
| 2017/0287789 A1 | 10/2017 | Bower et al. | |
| 2017/0338374 A1 | 11/2017 | Zou et al. | |
| 2018/0031974 A1 | 2/2018 | Prevatte et al. | |
| 2018/0033853 A1* | 2/2018 | Bower | H01L 27/3288 |
| 2018/0090394 A1 | 3/2018 | Bower et al. | |
| 2020/0243467 A1 | 7/2020 | Prevatte et al. | |

FOREIGN PATENT DOCUMENTS

| | | | |
|---|---|---|---|
| WO | WO-2008/103931 A2 | 8/2008 | |
| WO | WO-2016/012409 A2 | 1/2016 | |
| WO | WO-2017/167954 A2 | 10/2017 | |

OTHER PUBLICATIONS

Cok, R. S. et al., AMOLED displays with transfer-printed integrated circuits, Journal of SID, 19(4):335-341 (2011).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Bower, C. A. et al., Transfer Printing: An Approach for Massively Parallel Assembly of Microscale Devices, IEE, Electronic Components and Technology Conference, 2008, pp. 1105-1109.

Cok, R. S. et al., 60.3: AMOLED Displays Using Transfer-Printed Integrated Circuits, Society for Information Display, 10:902-904 (2010).

Hamer et al., 63.2: AMOLED Displays Using Transfer-Printed Integrated Circuits, SID 09 Digest, 40(2):947-950 (2009).

Howlader, M. M. R. et al., Nanobonding Technology Toward Electronic, Fluidic, and Photonic Systems Integration, IEEE, Journal of Selected Topics in Quantum Electronics, 17(3):689-703, (2011).

Kim, S. et al, Microstructural elastomeric surfaces with reversible adhesion and examples of their use in deterministic assembly by transfer printing, PNAS, 107(40):17095-17100 (2010).

Roscher, H., VCSEL Arrays with Redundant Pixel Designs for 10Gbits/s 2-D Space-Parallel MMF Transmission, Annual Report, optoelectronics Department, (2005).

Yaniv et al., A 640×480 Pixel Computer Display Using Pin Diodes with Device Redundancy, 1988 International Display Research Conference, IEEE, CH-2678-1/88:152-154 (1988).

Cok, R. S. et al., Inorganic light-emitting diode displays using micro-transfer printing, Journal of the SID, 25(10):589-609, (2017).

Trindade, A.J. et al., Precision transfer printing of ultra-thin AlInGaN micron-size light-emitting diodes, Crown, pp. 217-218, (2012).

Bower, C. A. et al., Micro-Transfer-Printing: Heterogeneous Integration of Microscale Semiconductor Devises using Elastomer Stamps, IEEE Conference, (2014).

* cited by examiner

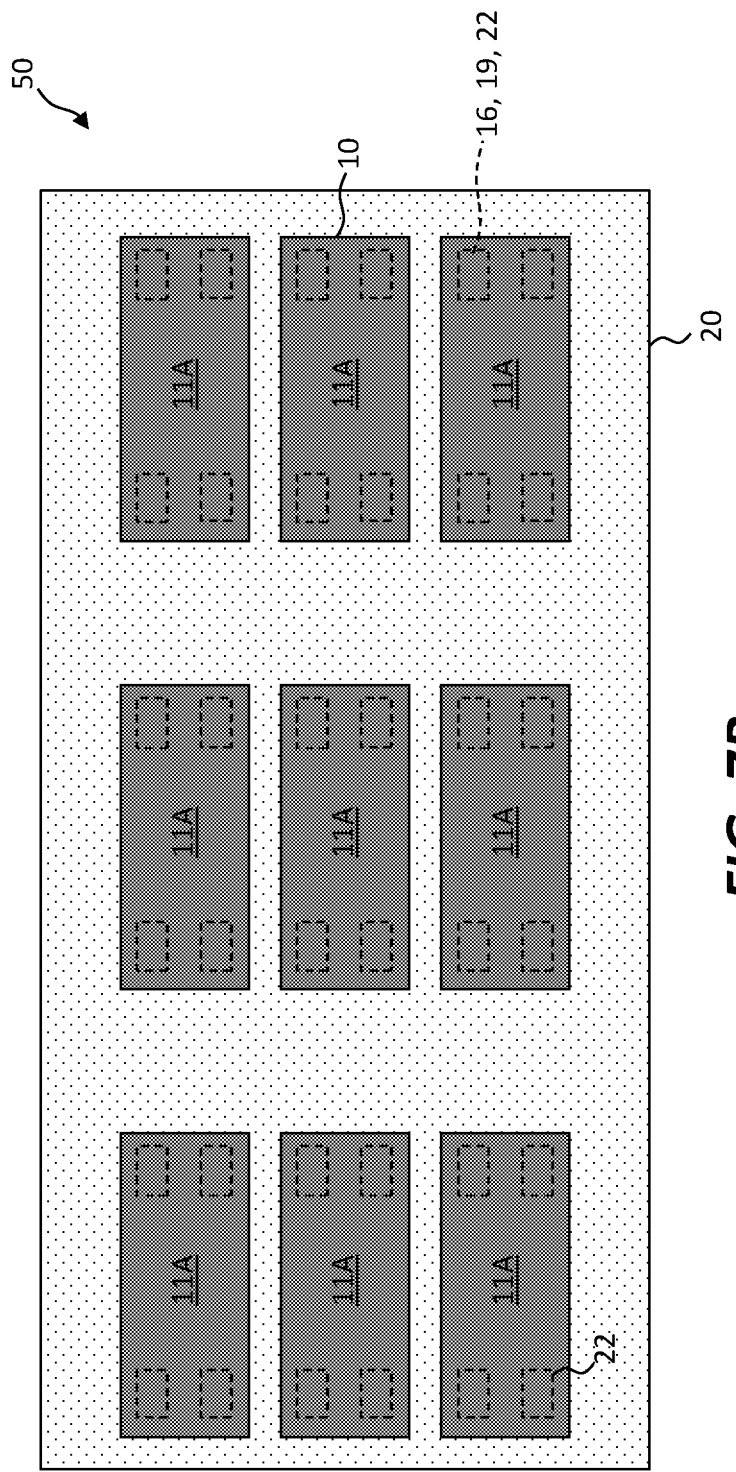

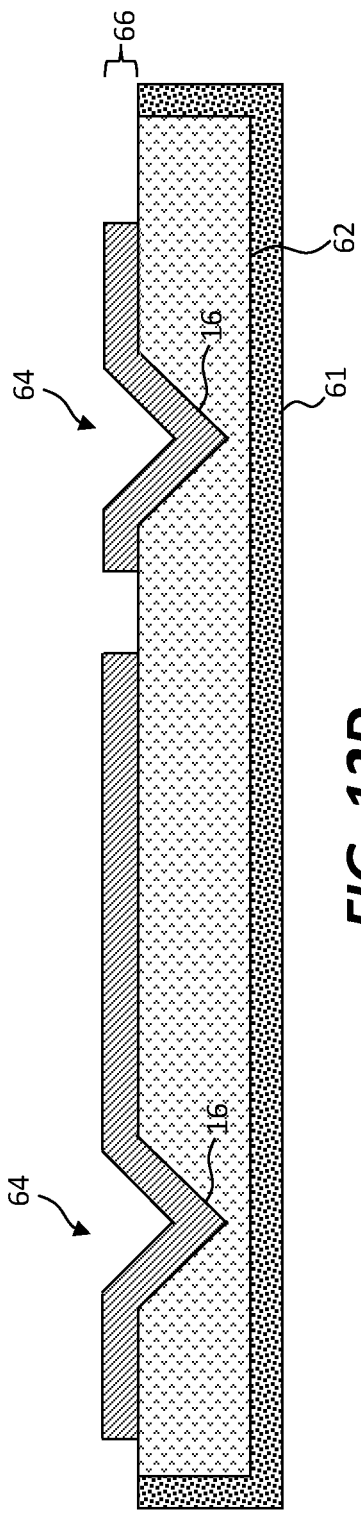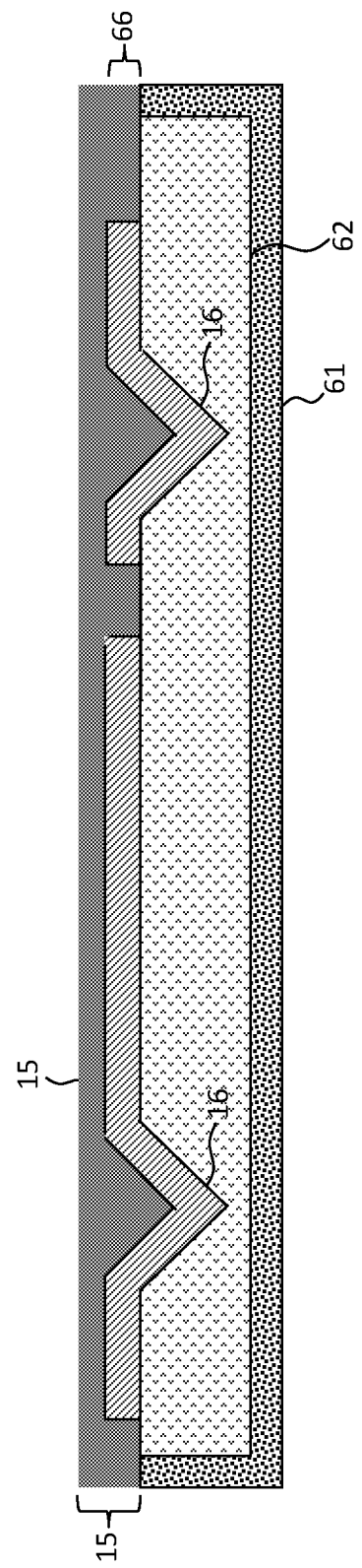
FIG. 12D
FIG. 12E

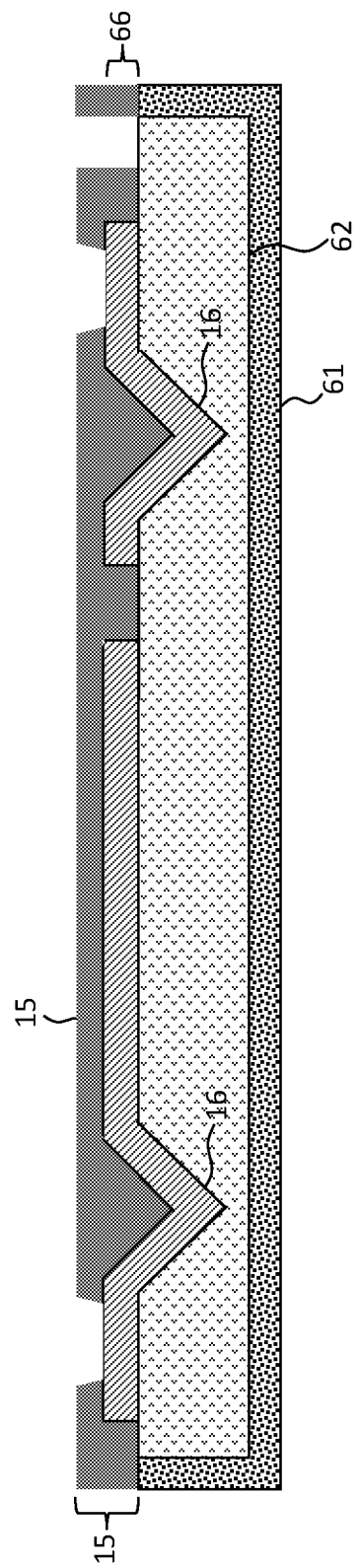

PRINTABLE 3D ELECTRONIC STRUCTURE

PRIORITY APPLICATION

This application claims priority to and benefit of U.S. Provisional Patent Application No. 62/371,008, filed Aug. 4, 2016, entitled Printable 3D Electronic Structure, the disclosure of which is hereby incorporated by reference in its entirety.

CROSS REFERENCE TO RELATED APPLICATIONS

Reference is made to U.S. Pat. No. 8,889,485, entitled Methods for Surface Attachment of Flipped Active Components by Christopher Bower, U.S. patent application Ser. No. 14/743,788, entitled Micro Assembled LED Displays and Lighting Elements by Christopher Bower et al., and U.S. patent application Ser. No. 14/822,864, entitled Chiplets with Connection Posts by Prevatte et al., the disclosures of which are incorporated herein by reference in its entirety.

FIELD OF THE INVENTION

The present invention relates generally to structures and methods for electrically interconnecting chiplets using micro-transfer printing.

BACKGROUND OF THE INVENTION

Substrates with electronically active components distributed over the extent of the substrate may be used in a variety of electronic systems, for example, flat-panel imaging devices such as flat-panel liquid crystal or organic light emitting diode (OLED) display devices and in flat-panel solar cells. A variety of methods may be used to distribute electronically active circuits over substrates, including forming the electronically active circuits on a substrate and forming the components on separate substrates and placing them on a substrate. In the latter case, a variety of assembly technologies for device packaging may be used.

The electronically active components are typically formed on a substrate by sputtering a layer of inorganic semiconductor material or by spin-coating organic material over the entire substrate. Inorganic semiconductor materials can be processed to improve their electronic characteristics, for example amorphous silicon can be treated to form low-temperature or high-temperature poly-crystalline silicon. In other process methods, microcrystalline semiconductor layers can be formed by using an underlying seeding layer. These methods typically improve the electron mobility of the semiconductor layer. The substrate and layer of semiconductor material can be photo-lithographically processed to define electronically active components, such as transistors. Such transistors are known as thin-film transistors (TFTs) since they are formed in a thin layer of semiconductor material, typically silicon. Transistors may also be formed in thin layers of organic materials. In these devices, the substrate is often made of glass, for example Corning Eagle® or Jade® glass designed for display applications.

The above techniques have some limitations. Despite processing methods used to improve the performance of thin-film transistors, such transistors may provide performance that is lower than the performance of other integrated circuits formed in mono-crystalline semiconductor material. Semiconductor material and active components can be provided only on portions of the substrate, leading to wasted material and increased material and processing costs. The choice of substrate materials can also be limited by the processing steps necessary to process the semiconductor material and the photo-lithographic steps used to pattern the active components. For example, plastic substrates have a limited chemical and heat tolerance and do not readily survive photo-lithographic processing. Furthermore, the manufacturing equipment used to process large substrates with thin-film circuitry is relatively expensive. Other substrate materials that may be used include quartz, for example, for integrated circuits using silicon-on-insulator structures as described in U.S. Patent Application No. 2010/0289115 and U.S. Patent Application No. 2010/0123134. However, such substrate materials can be more expensive or difficult to process.

Other methods used for distributing electronically functional components over a substrate in the circuit board assembly industry include, for example, pick-and-place technologies for integrated circuits provided in a variety of packages, for example, pin-grid arrays, ball-grid arrays, and flip-chips. However, these techniques may be limited in the size of the integrated circuits that can be placed.

In further manufacturing techniques, a mono-crystalline semiconductor wafer is employed as the substrate. While this approach can provide substrates with the same performance as integrated circuits, the size of such substrates may be limited, for example, to a 12-inch diameter circle, and the wafers are relatively expensive compared to other substrate materials such as glass, polymer, or quartz.

In yet another approach, thin layers of semiconductor are bonded to a substrate and then processed. Such a method is known as semiconductor-on-glass or silicon-on-glass (SOG) and is described, for example, in U.S. Pat. No. 7,605,053, issued Oct. 20, 2009. If the semiconductor material is crystalline, high-performance thin-film circuits can be obtained. However, the bonding technique and the processing equipment for the substrates to form the thin-film active components on large substrates can be relatively expensive.

Publication No. 11-142878 of the Patent Abstracts of Japan entitled Formation of Display Transistor Array Panel describes etching a substrate to remove it from a thin-film transistor array on which the TFT array was formed. TFT circuits formed on a first substrate can be transferred to a second substrate by adhering the first substrate and the TFTs to the surface of the second substrate and then etching away the first substrate, leaving the TFTs bonded to the second substrate. This method may require etching a significant quantity of material, and may risk damaging the exposed TFT array.

Other methods of locating material on a substrate are described in U.S. Pat. No. 7,127,810. In this approach, a first substrate carries a thin-film object to be transferred to a second substrate. An adhesive is applied to the object to be transferred or to the second substrate in the desired location of the object. The substrates are aligned and brought into contact. A laser beam irradiates the object to abrade the transferring thin film so that the transferring thin film adheres to the second substrate. The first and second substrates are separated, peeling the film in the abraded areas from the first substrate and transferring it to the second substrate. In one embodiment, a plurality of objects is selectively transferred by employing a plurality of laser beams to abrade selected area. Objects to be transferred can include thin-film circuits.

U.S. Pat. No. 6,969,624 describes a method of transferring a device from a first substrate onto a holding substrate by selectively irradiating an interface with an energy beam.

The interface is located between a device for transfer and the first substrate and includes a material that generates ablation upon irradiation, thereby releasing the device from the substrate. For example, a light-emitting device (LED) is made of a nitride semiconductor on a sapphire substrate. The energy beam is directed to the interface between the sapphire substrate and the nitride semiconductor releasing the LED and allowing the LED to adhere to a holding substrate coated with an adhesive. The adhesive is then cured. These methods, however, may require the patterned deposition of adhesive on the object(s) or on the second substrate. Moreover, the laser beam that irradiates the object may need to be shaped to match the shape of the object, and the laser abrasion can damage the object to be transferred. Furthermore, the adhesive cure takes time, which may reduce the throughput of the manufacturing system.

Another method for transferring active components from one substrate to another is described in *AMOLED Displays using Transfer-Printed Integrated Circuits* published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In such methods it is generally necessary to electrically connect the small integrated circuits or chiplets to electrically conductive elements such as backplane contact pads on the destination substrate. By applying electrical signals to conductors on the destination substrate the small integrated circuits are energized and made operational. The electrical connections between the small integrated circuits and the backplane contact pads are typically made by photolithographic processes in which a metal is evaporated or sputtered onto the small integrated circuits and the destination substrate to form a metal layer, the metal layer is coated with a photoresist that is exposed to a circuit connection pattern, and the metal layer and photoresist are developed by etching and washing to form the patterned electrical connections between the small integrated circuits and the connection pads on the destination substrate. Additional layers, such as interlayer dielectric insulators can also be required. This process is expensive and requires a number of manufacturing steps. Moreover, the topographical structure of the small integrated circuits over the destination substrate renders the electrical connections problematic, for example it can be difficult to form a continuous conductor from the destination substrate to the small integrated circuit because of the differences in height over the surface between the small integrated circuits and the destination substrate.

As integrated circuit technology progresses, ever-smaller features are used in electronic elements such as transistors and interconnections to reduce power, improve switching speed, and increase density. To increase density further, some electronic systems use stacked integrated circuits, for example as taught in U.S. Patent Publication No. 20010033030. However, these structures require packaged integrated circuits and thermal diffusion bond layers, increasing the size and interconnection complexity of the structure. Other methods use stacked die layers with through interconnects, for example as discussed in U.S. Patent Publication No. 20130293292, but construction of through interconnections, for example with through silicon vias, is difficult. Other methods employ interface wafers with through silicon vias to interconnect bonded active-circuitry wafers (U.S. Patent Publication No. 20100044826) or integrated circuits (U.S. Patent Publication No. 20120313207) but these are limited in the number of layers that can be interconnected.

There is a need, therefore, for structures and methods that enable the electrical interconnection of small integrated circuits, such as printable chiplets, in simple, inexpensive, extensible, and flexible ways that enable robust, three-dimensional electronic or opto-electronic structures.

SUMMARY OF THE INVENTION

The present invention provides, inter alia, structures and methods for electrically connecting relatively small electrical components such as integrated circuit chiplets in a simple, efficient, extensible, flexible, and cost-effective way that enables robust, three-dimensional electronic or opto-electronic structures. The integrated circuit chiplets (chiplets) can be electrically connected to a destination substrate or one chiplet can be electrically connected directly to another chiplet, for example in a three-dimensional stack of chiplets.

In accordance with some embodiments of the present invention, a micro-transfer printable electronic component includes a component substrate and a circuit disposed in or on the component substrate, one or more electrically conductive connection posts protruding from the component substrate, and one or more electrically conductive exposed component contact pads on or over the component substrate on a side of the component substrate opposite the one or more connection posts. The one or more component contact pads and the one or more electrically conductive connection posts are both electrically connected to the circuit.

In some embodiments, a printed electronic structure includes at least first and second printable electronic components and at least one of the connection posts of the second component is in electrical contact with at least one of the component contact pads of the first component. In some embodiments, connection posts and contact pads of the first and second components are disposed in spatially corresponding locations and can be aligned in a direction orthogonal to the component surface so that the second component can be micro-transfer printed onto and electrically connected with the first component. In some embodiments, a component is micro-transfer printed with aligned connection posts and contact pads onto two or more other components. Different components (e.g., directly electrically connected components) can be spatially offset from each other in one dimension, two dimensions or three dimensions. In some embodiments, connection posts are aligned and in electrical contact with destination substrate contact pads on a destination substrate. In certain embodiments, two or more component contact pads are spatially separated from each other as disposed on a component substrate.

In various configurations, a component substrate has at least one of a width, length, and height from 1 to 2 µm, 2 to 5 µm, 5 to 10 µm, 10 to 20 µm, or 20 to 50 µm.

In accordance with some embodiments of the present invention, a micro-transfer printable component source wafer includes a wafer substrate having one or more sacrificial portions spaced apart by anchor portions and a component disposed entirely over each sacrificial portion and connected to at least one anchor portion by one or more tethers. A wafer substrate can be anisotropically etchable and each sacrificial portion can be a designated portion of the wafer substrate. In some embodiments, each sacrificial portion comprises sacrificial material that is differentially etchable from the wafer substrate, or the sacrificial portion can be a gap between a component and the wafer substrate.

In some embodiments, a circuit is a passive circuit, includes only wires, includes resistors, includes capacitors, is a capacitor, or is an active circuit including one or more transistors.

In some embodiments, components have the same circuits, the same number or disposition of contact pads, or the same number or disposition of connection posts. In some embodiments, the components have different circuits, different numbers or dispositions of contact pads, or different numbers or dispositions of connection posts.

A method of making a micro-transfer printed electronic structure according to some embodiments of the present invention includes providing a micro-transfer printable component source wafer, providing a destination substrate having one or more destination substrate contact pads, and providing one or more micro-transfer printing stamps. At least a first component is micro-transfer printed from the source wafer to the destination substrate using a stamp. At least one connection post of the first component is aligned and in electrical contact with at least one destination substrate contact pad. At least a second component is micro-transfer printed from the source wafer to the first component using a stamp and at least one connection post of the second component is aligned and in electrical contact with at least one component contact pad of the first component.

In some embodiments, the second component is micro-transfer printed so that each connection post of the second component is aligned and in electrical contact with at least one component contact pad of the first component. In another embodiment, at least a third component is micro-transfer printed from a component source wafer to the destination substrate using a stamp before micro-transfer printing the second component. At least one connection post of the third component is aligned and in electrical contact with at least one destination substrate contact pad. The second component is micro-transfer printed so that at least one connection post of the second component is aligned and in electrical contact with at least one component contact pad of the third component.

In some embodiments, a micro-transfer printable electronic component includes a component substrate and a plurality of capacitors formed in or on the component substrate. In some embodiments, capacitors are electrically connected in parallel and have first and second capacitor terminals. First and second electrically conductive connection posts protrude from the component substrate. The first connection post is electrically connected to the first capacitor terminal and the second connection post is electrically connected to the second capacitor terminal separately from the first terminal. In some embodiments, capacitors are vertical capacitors. In some embodiments, capacitors are horizontal capacitors. The capacitors can be formed in or on a side of the component substrate opposite the connection posts or within the component substrate.

In some embodiments of the present invention, two or more directly electrically connected connection posts are provided to contact a common destination substrate contact pad. In some embodiments, two or more directly electrically connected contact pads are provided to contact one or more directly electrically connected connection posts. By providing two or more connection posts in contact with a common destination substrate contact pad or providing two or more component contact pads in contact with a commonly electrically connected connection posts, faults in electrical connections between the component and the destination substrate contact pad or component contact pads are reduced by providing redundant electrical connections.

The present invention provides, inter alia, structures and methods that enable the construction of electrical interconnections between small integrated circuits that are printed (e.g., micro-transfer printed) onto each other or onto a destination substrate. In certain embodiments, the electrical interconnection process is simple and inexpensive requiring fewer process steps than known alternative methods and provides a robust, three-dimensional electronic structure that is indefinitely expandable in a variety of configurations and circuits.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 7B is a plan view of the destination substrate of FIG. 8A with printed components in an illustrative embodiment of the present invention corresponding in part to FIG. 2;

FIGS. 12A-12F are sequential cross sections illustrating a method of making an illustrative embodiment of the present invention;

Figure 1:
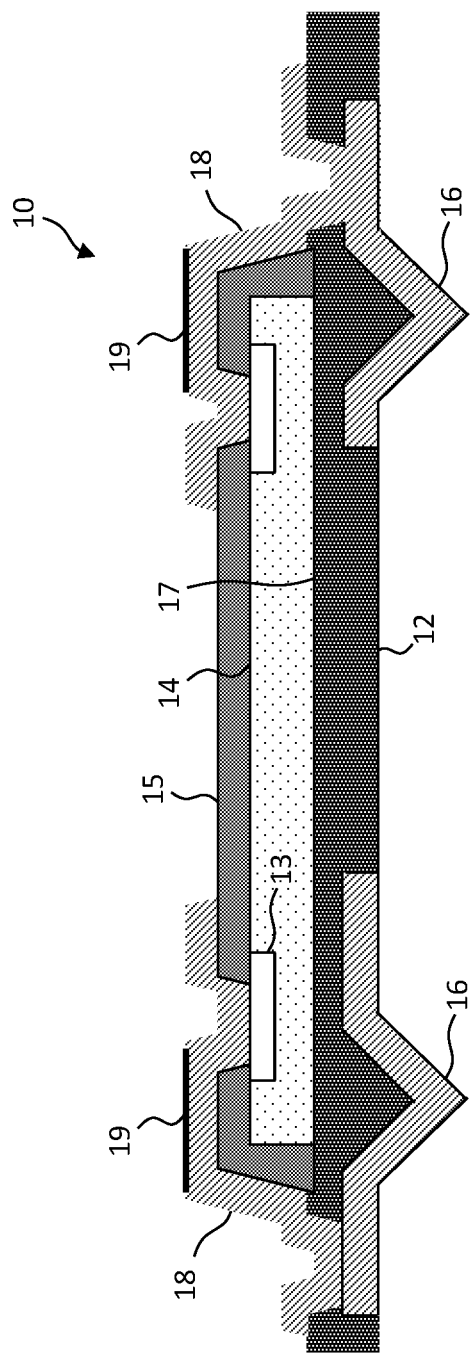
FIG. 1 is a cross section of a printable component in an illustrative embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides, inter alia, structures and methods for electrically connecting relatively small electrical components such as integrated circuit chiplets in a simple, efficient, extensible, flexible, and cost-effective way. The integrated circuit chiplets (chiplets) can be electrically connected to a destination substrate or one chiplet can be electrically connected directly to another chiplet, for example in a three-dimensional stack of chiplets, or to three or more chiplets, forming a three-dimensional electronic structure.

Referring to the cross section of FIG. 1, in some embodiments of the present invention, a printable (e.g., micro-transfer printable) electronic component 10 or printed electronic component 10 (hereinafter component 10) includes a component substrate 12 and a circuit 14 disposed in or on the component substrate 12, for example disposed on a component surface 17 of the component substrate 12. The circuit 14 can include or be electrically connected to at least one or more electrodes 18 formed at least partly in or on the component substrate 12 or in or on the circuit 14. The electrodes 18 are patterned electrical conductors, such as wires. One or more electrically conductive connection posts 16 protrude from the component substrate 12 and one or more electrically conductive exposed component contact pads 19 are disposed on or over the component substrate 12 on a side of the component substrate 12 opposite the one or more connection posts 16. The one or more component contact pads 19 pads and the one or more electrically conductive connection posts 16 are both electrically connected to the circuit 14, for example, with the one or more electrically conductive electrodes 18.

In certain embodiments, components 10 of the present invention can be micro-transfer printed. Micro-transfer printing can transfer very small integrated circuit chiplets from a source wafer to a destination substrate. Other methods, such as pick-and-place or surface-mount techniques cannot transfer such small components 10. In some embodiments of the present invention, the component substrate 12 has at least one of a width, length, and height from 1 to 2 µm, 2 to 5 µm, 5 to 10 µm, 10 to 20 µm, or 20 to 50 µm.

The circuit 14 can, optionally, include circuit contact pads 13 designating electrical connections to the circuit 14. The electrodes 18 can be electrical conductors electrically connected to the component contact pads 19 or the connection posts 16, or both (as shown in FIG. 1). In some embodiments, the electrodes 18 are not a separate electrically conductive element but are portions of, for example, any combination of the connection posts 16, circuit contact pads 13, or component contact pads 19. The component contact pads 19 can be the circuit contact pads 13, one or more designated portions of the electrodes 18, or other different electrical connections. The component contact pads 19, circuit contact pads 13, and electrodes 18 are shown as separate elements for clarity in understanding but can be the same electrically conductive elements (e.g., can be made from the same electrically conductive material(s)) or have common portions of the same electrically conductive elements. A patterned dielectric structure 15 or layer can optionally insulate portions of the circuit 14 and provide vias for the electrodes 18 to electrically connect to the circuit contact pads 13. A patterned dielectric structure 15 is shown in FIG. 1.

The connection posts 16 can be electrically connected to the circuit 14 separately from the component contact pads 19 or directly electrically connected in common to the circuit 14 and component contact pads 19 (as shown in FIG. 1). Thus, the connection posts 16, component contact pads 19, and circuit 14 can be electrically connected in parallel or in series in various configurations. In various embodiments, each connection post 16 is directly electrically connected to one component contact pad 19 (as shown in FIG. 1), each connection post 16 is directly electrically connected to two or more component contact pads 19, or each component contact pad 19 is directly electrically connected to two or more connection posts 16. Each connection post 16 can be uniquely connected to a single component contact pad 19 or multiple connection posts 16 can be connected to a single common component contact pad 19. Each component contact pad 19 can be uniquely connected to a single connection post 16 or multiple component contact pads 19 can be connected to a single common connection post 16 or to multiple connection posts 16. In certain embodiments, two or more component contact pads 19 are spatially separated from each other as disposed on a component substrate 12.

Figure 24:
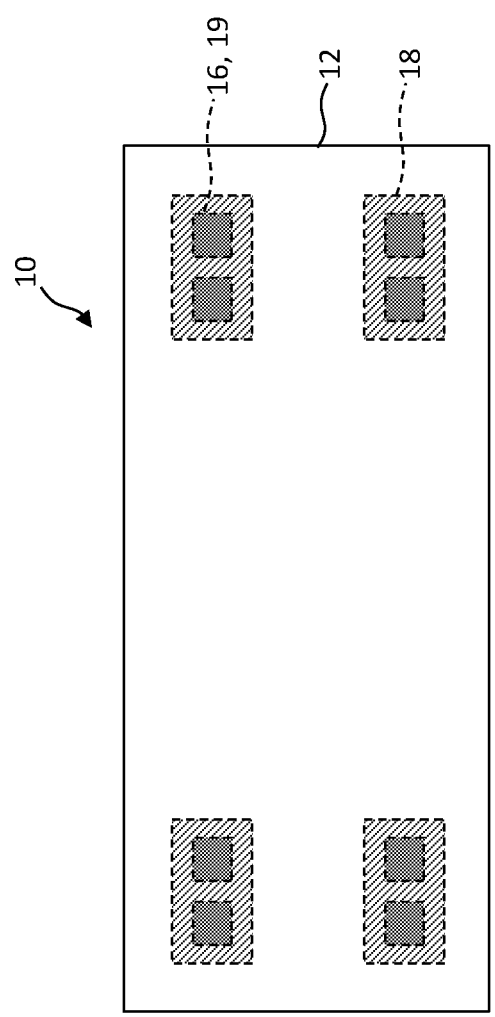
FIG. 24 is a plan view of a component with redundant component contact pads and connection posts in accordance with an illustrative embodiment of the present invention.

Referring to FIG. 24, multiple connection posts 16 can be directly electrically connected together for example with an electrode 18 to provide redundant connection posts 16 providing a single electrical connection in a component 10. Similarly, multiple component contact pads 19 can be directly electrically connected together to provide redundant component contact pads 19 providing a single electrical connection. Two elements are directly electrically connected, as used herein, if there are no other electrical elements electrically connected in series between the two directly electrically connected elements. In some embodiments, redundant electrical connections can increase manufacturing yields.

A component substrate 12 can be any substrate on which circuits 14, electrodes 18, insulating layers or patterned dielectric structures 15, and electrical conductors (e.g., electrodes 18) can be formed, for example a semiconductor substrate or a glass or plastic substrate as found in the display or integrated circuit industries. The component substrate 12 can be rigid or flexible as well as transparent or opaque. Electrodes 18 can be any patterned electrical conductor, for example electrically conductive metal wires or traces, can be metal oxide conductors, or can be organic conductors and can be transparent or opaque, and can be provided in various widths, materials, and thicknesses.

A circuit 14 can be formed in or on a component substrate 12, and can include, for example, transistors formed in or on a semiconductor component substrate 12 or electrodes 18 formed in or on a semiconductor, glass, or plastic component substrate 12. In some embodiments, a circuit 14 can be formed in a circuit substrate separate from a component substrate 12 and disposed on the component substrate 12, for example, by micro-transfer printing the circuit substrate from a circuit substrate source wafer to the component substrate 12. Circuit connection pads 13 can be metallized or otherwise electrically conductive portions of the component substrate 12 or the circuit substrate (if present), or can simply be designated portions of the component substrate 12 or the circuit substrate (if present) or a designated portion of the circuit 14 to which the electrodes 18 are electrically connected.

In various embodiments of the present invention, a circuit 14 is a passive circuit. For example, the circuit 14 can include only wires and only provide electrical connections. For example, in some embodiments, a circuit 14 forms an electrical jumper or electrical pass-through from a connection post 16 to a component contact pad 19. In some embodiments, a circuit 14 is an active circuit including one or more transistors or diodes, for example, light-emitting diodes. A circuit 14 can include resistors or capacitors or be a resistor or capacitor, or include multiple capacitors or resistors electrically connected in series or in parallel. In some embodiments, a circuit 14 comprises both passive and active elements.

Connection posts 16 are electrically conductive and can include a non-conductive structure coated with an electrically conductive layer, such as a metal layer. Connection posts 16 can protrude from a component substrate 12 in a direction orthogonal to the component surface 17 of the component substrate 12. The connection posts 16 can be a spike and have a point with a smaller area than a base adjacent to the component substrate 12.

In some embodiments, and as shown in FIG. 1, connection posts 16 and component contact pads 19 are disposed in spatially corresponding (e.g., aligned) and matching locations. In some embodiments, connection posts 16 and component contact pads 19 are disposed in non-corresponding (e.g., unaligned) locations such that component contact pads 19 are disposed no more than partially over (e.g., not at all over) connection posts 16. The number of connection posts 16 can be the same as the number of component contact pads 19 or the number of connection posts 16 can be different from the number of component contact pads 19. In some embodiments, the relative locations of connection posts 16 in a plane parallel to the component surface 17 is the same as the relative locations of component contact pads 19 so that if connection posts 16 of a second component 10 are located adjacent to connection posts 16 of a first component 10, connection posts 16 of the second component 10 and component contact pads 19 of the first component 10 could align so that connection posts 16 could be in electrical contact with corresponding component contact pads 19. In some embodiments, and as shown in FIG. 1, connection posts 16 and the component contact pads 19 are aligned in a direction orthogonal to the component surface 17. Thus, pressure applied to a component contact pad 19 will be transmitted to a corresponding connection post 16, reducing stress on the component substrate 12 and helping to mitigate component substrate 12 cracking, for example, during micro-transfer printing operations as described further below.

Figure 2:
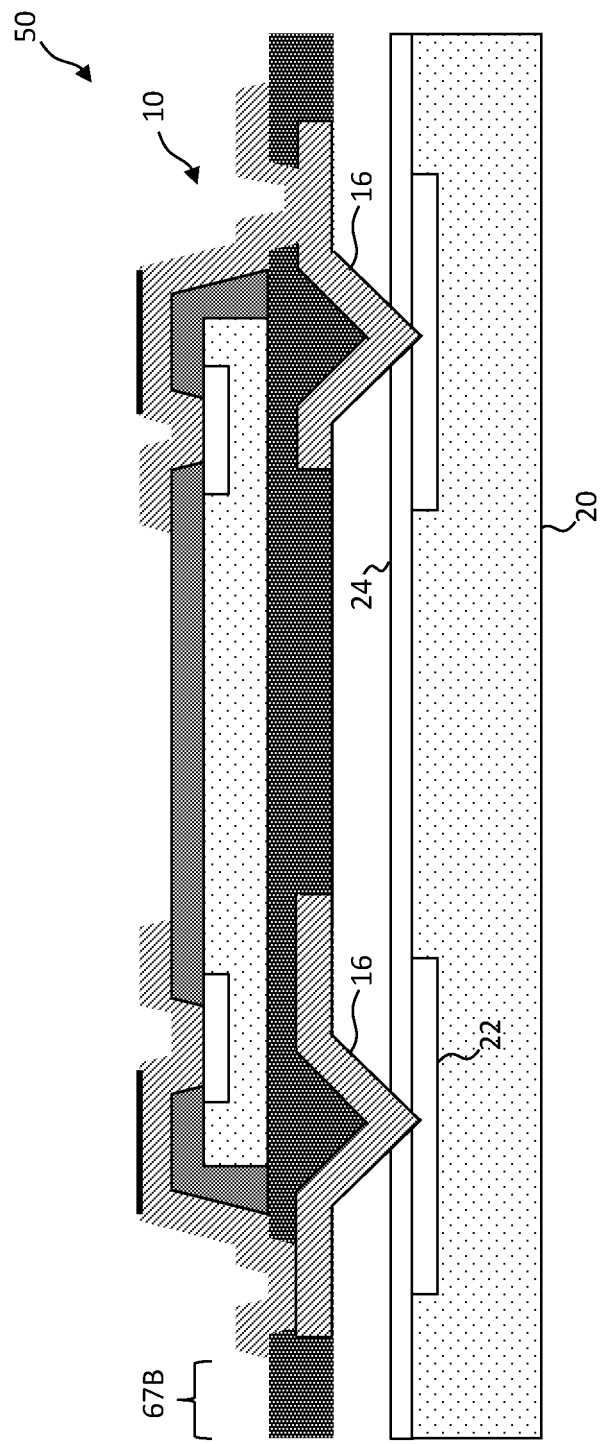
FIG. 2 is a cross section of a printed component on a destination substrate in an illustrative embodiment of the present invention.

Referring to FIG. 2, in some embodiments of the present invention, a component 10 includes a destination substrate 20 having one or more destination substrate contact pads 22. The destination substrate 20 is separate, distinct, and independent of the component substrate 12 and is non-native to the circuit 14. The destination substrate contact pads 22 can include a soft metal, for example silver, tin, gold, or solder, or a harder metal. At least one connection post 16 is in electrical contact with at least one destination substrate contact pad 22. A connection post 16 can extend into or through, be in contact with, driven into, pierce, be crumpled, adhered to, welded, or otherwise affixed to a corresponding destination substrate contact pad 22 to electrically connect the connection post 16 to the destination substrate contact pad 22, for example, using micro-transfer printing.

Multiple directly electrically connected connection posts 16 can be electrically connected to a common destination substrate contact pad 22. Electrically separate connection posts 16 can be electrically connected to electrically separate destination substrate contact pads 22 (as shown in FIG. 2). Electrically separate electrical elements are electrical elements that are not directly electrically connected.

An adhesive layer 24 can be coated in a pattern over the destination substrate contact pads 22 or, as shown in FIG. 2, can be coated over at least a portion of the destination substrate 20 and destination substrate contact pads 22. In certain embodiments, when micro-transfer printed, connection posts 16 can press through the adhesive layer 24 to make electrical contact with destination substrate contact pads 22. In some embodiments, an adhesive layer 24 is curable and can be cured to adhere a component substrate 12 to a destination substrate 20 and help make the electrical connection between the connection posts 16 and the destination substrate contact pads 22 robust. A micro-transfer printed component 10 can have one or more broken tethers 67B resulting from micro-transfer printing the component 10 to a destination substrate 20.

Figure 3:
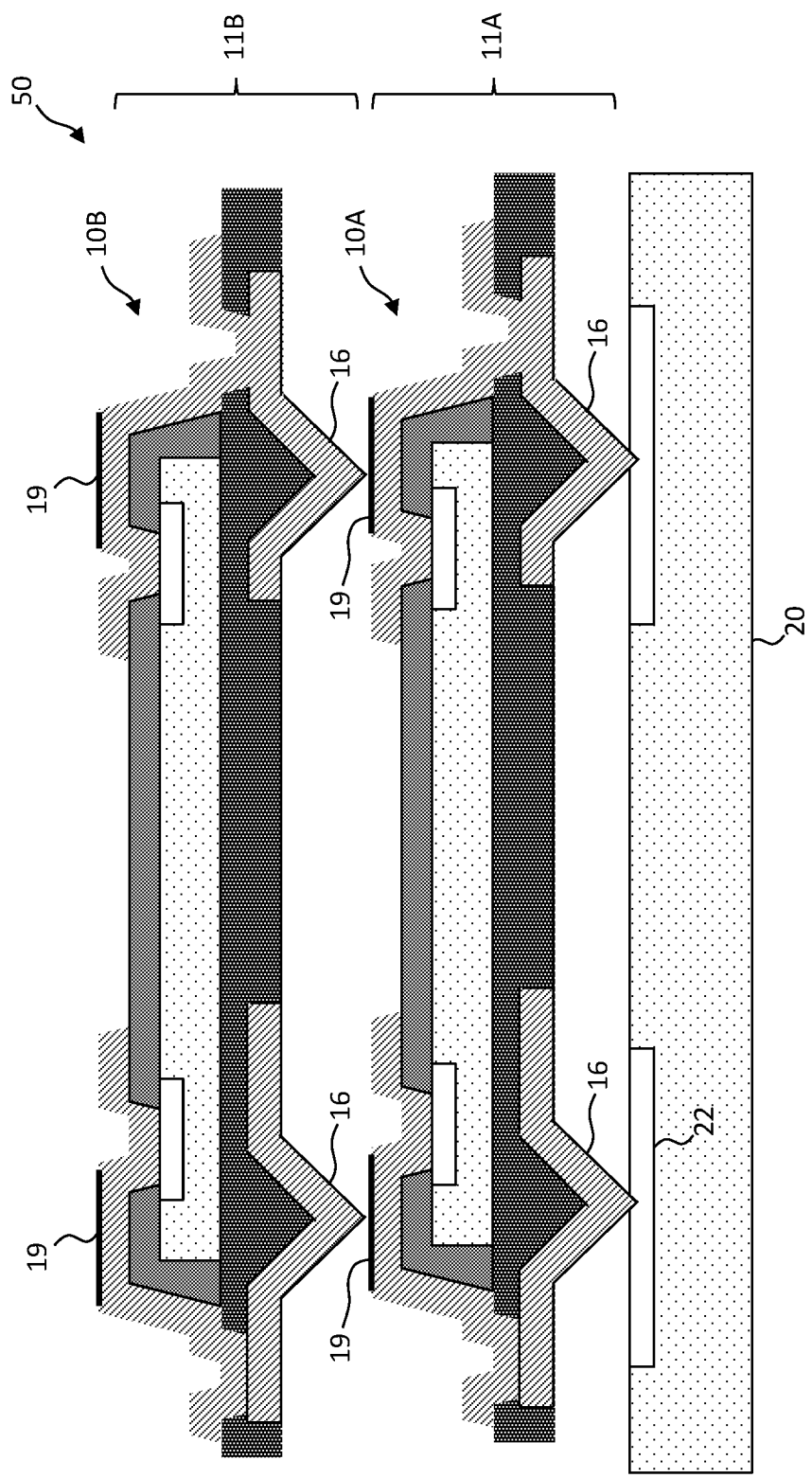
FIGS. 3-6 are cross sections of stacked printed components in various embodiments of the present invention.

Referring to FIGS. 3-6, in some embodiments, components 10 can be stacked in levels or layers to form a three-dimensional micro-transfer printed electronic structure 50 (hereinafter electronic structure 50) having two or more directly electrically connected first and second components 10A, 10B disposed on a destination substrate 20 and electrically connected to destination substrate contact pads 22. As shown in FIG. 3, first and second electronic components 10A, 10B are disposed over destination substrate 20. Second component 10B is stacked in a second level 11B on the first component 10A in a first level 11A. The connection posts 16 of the first component 10A are micro-transfer printed onto and in electrical contact with the destination substrate contact pads 22. Each of the connection posts 16 of the second component 10B are in electrical contact with a corresponding one of the component contact pads 19 of the first component 10A, so that the second component 10B is stacked only onto the first component 10A.

Figure 16:
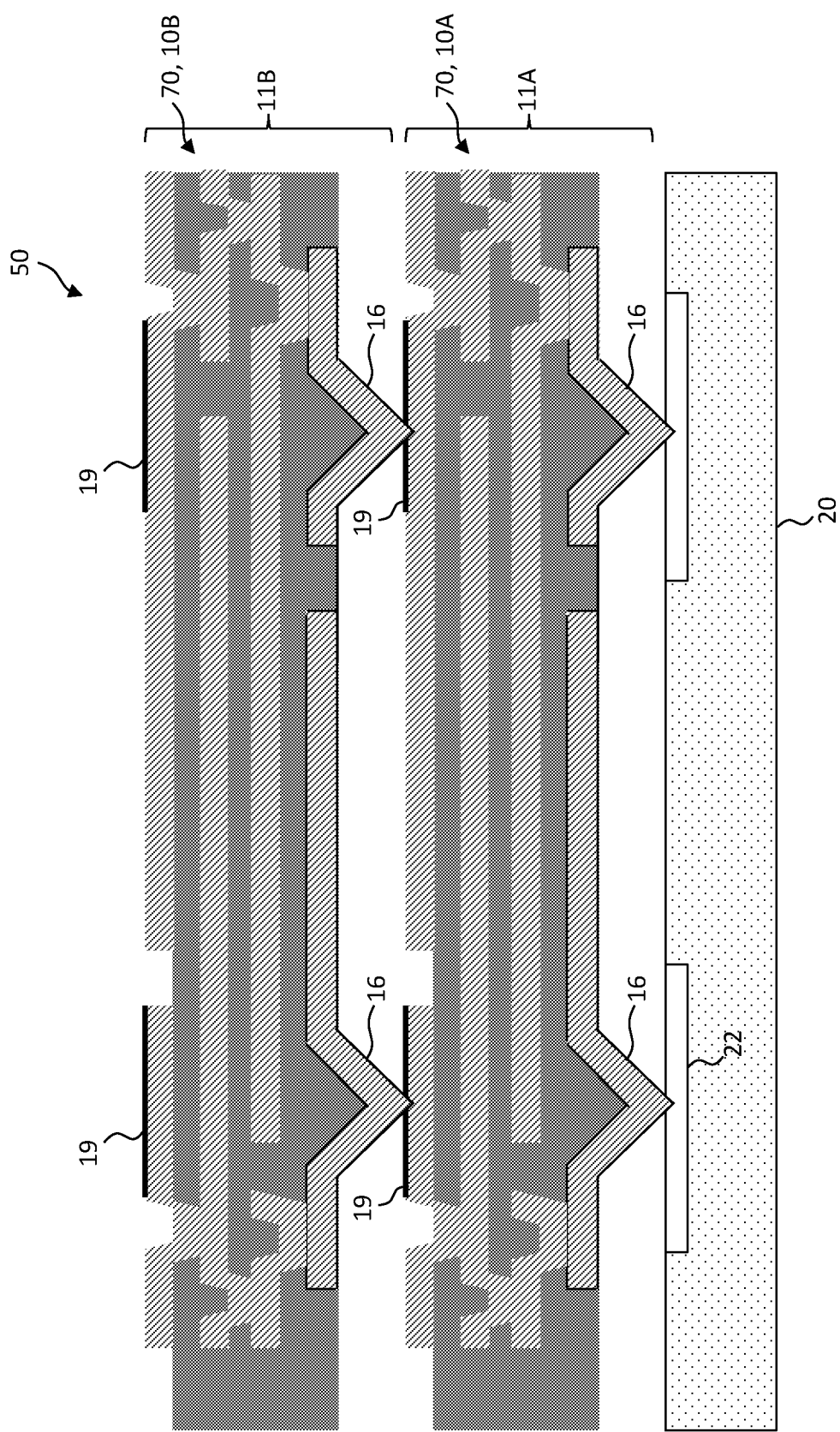
FIG. 16 is a cross section of stacked printed components on a destination substrate in an illustrative embodiment of the present invention.

The first and second components 10A, 10B can have the same structure and circuit 14 or can have different structures and circuits 14. For example, in some embodiments, the circuit 14 in both of first and second components 10A, 10B are capacitors and the capacitors are electrically connected in parallel (as shown in FIG. 16) so that the electronic structure 50 forms a capacitor having twice the capacitance of either of the first and second components 10A, 10B. In some embodiments, circuits 14 of a first and second component 10A, 10B can be different. For example, a second component 10B can be a capacitor providing capacitance to the circuit 14 of a first component 10A. In another exemplary embodiment, the circuit 14 of a second component 10B includes one or more inorganic micro-light-emitting diodes controlled by the circuit 14 of the first component 10A. By stacking first and second components 10A and 10B in corresponding first and second levels 11A, 11B, the area required by the first and second components 10A and 10B over the destination substrate 20 (for example a printed circuit board) is reduced, increasing the circuit density of any system incorporating the electronic structure 50 and providing a three dimensional electronic circuit.

Figure 4:
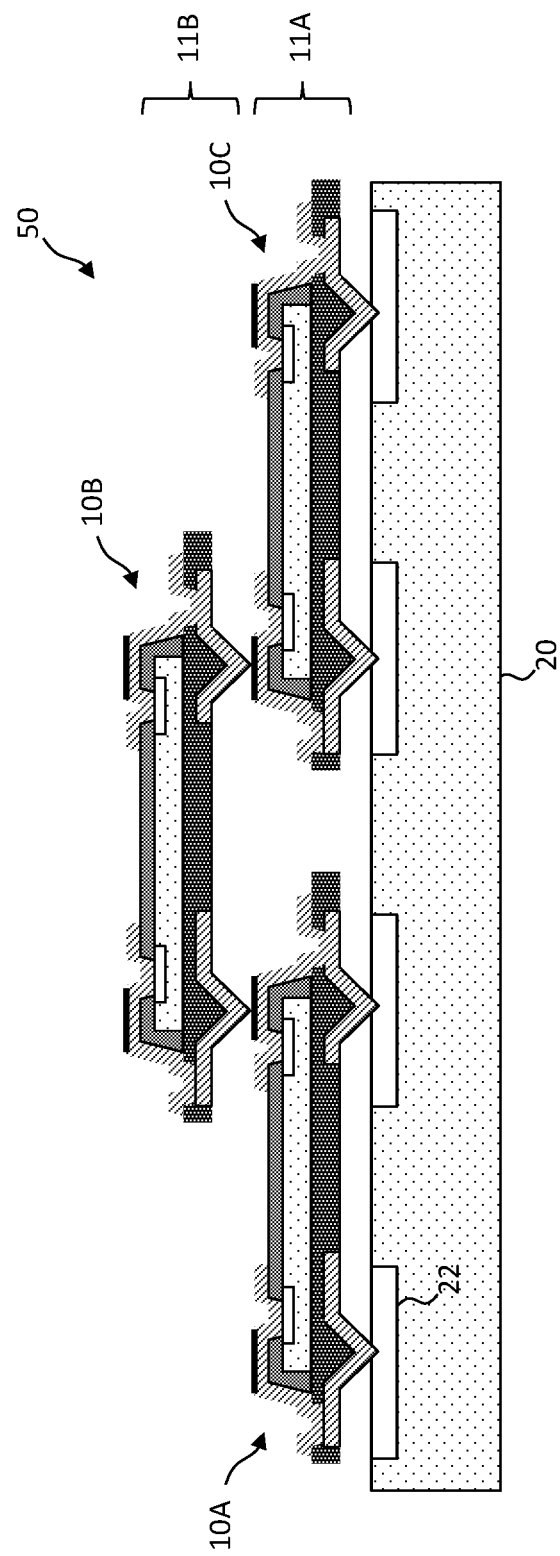

Referring to FIG. 4, in some embodiments, a micro-transfer printed electronic structure 50 includes a third micro-transfer printable electronic component 10C disposed on the destination substrate 20 in a common first level 11A with the first component 10A and having one or more connection posts 16 electrically connected to destination substrate contact pads 22. Second component 10B is stacked upon both the first and third components 10A, 10C in a second level 11B. At least one of the connection posts 16 of the second component 10B is in electrical contact with at least one of the component contact pads 19 of the first component 10A and at least one of the connection posts 16 of the second component 10B is in electrical contact with at least one of the component contact pads 19 of the third component 10C. Thus, a single second component 10B can be stacked upon two separate first and third components 10A, 10C and be electrically connected to them both, so long as the relative spacing of the first and third components 10A, 10C on the destination substrate 20 spaces the component contact pads 19 apart by a distance corresponding to the spacing of at least two of the connection posts 16 of the second component 10B.

Figure 5:
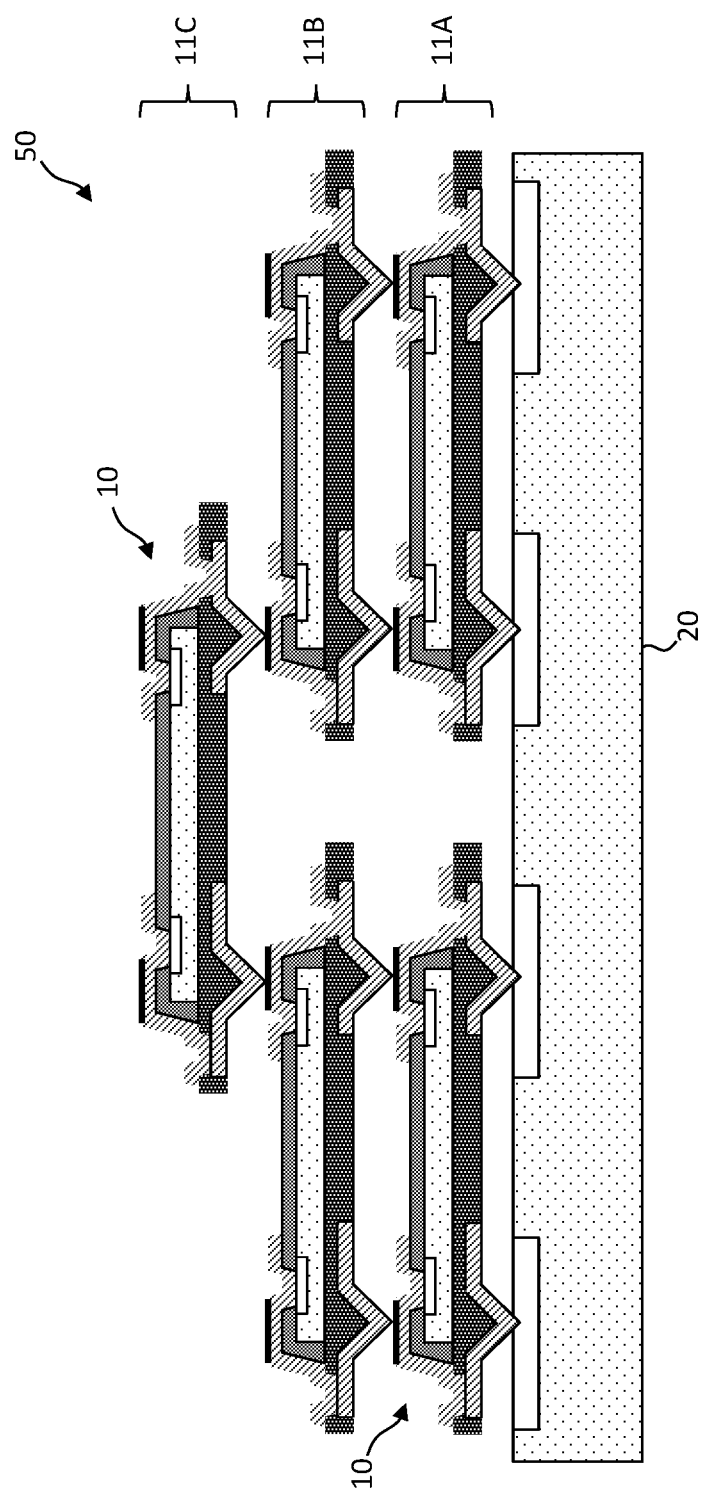
Figure 6:
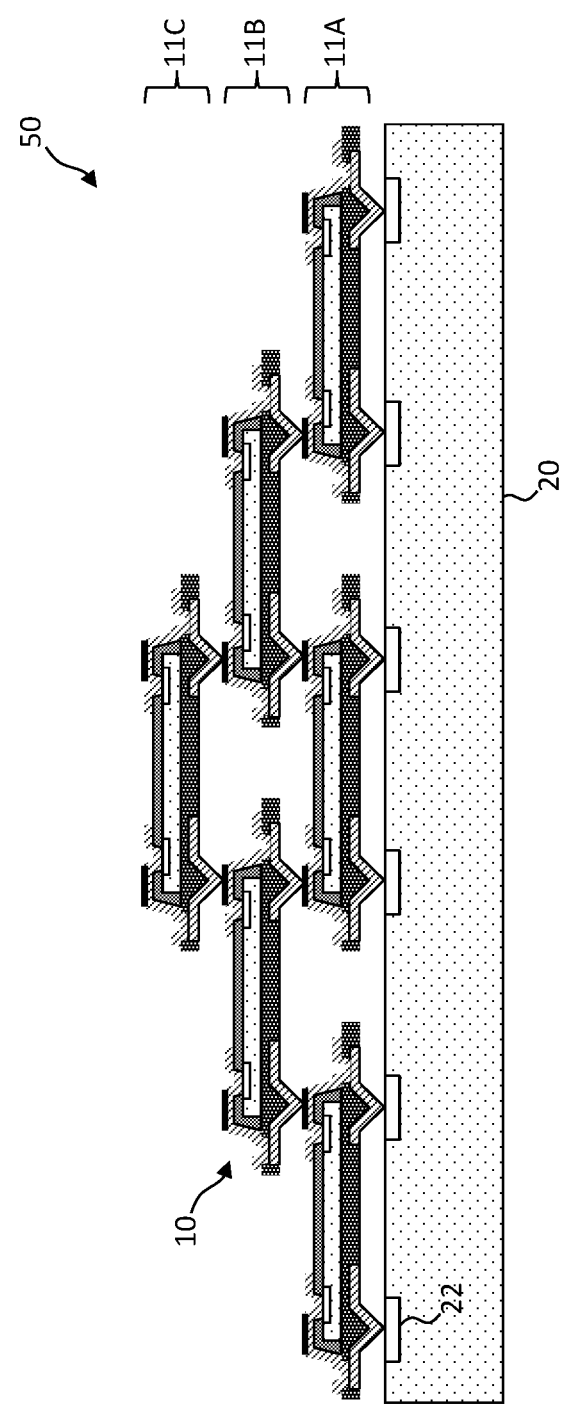

Electronic structures 50 in accordance with certain embodiments of the present invention can be extended to a wide variety of components 10 and stacking configurations. Referring to FIG. 5, a three-level electronic structure 50 includes two components 10 disposed in a first level 11A on the destination substrate 20. Two components 10 are each stacked in a second level 11B, each on one of the two components 10 in first level 11A. Each of the components 10 in the second level 11B is electrically connected to only one component 10 in the first level 11A. A further component 10 is disposed in a third level 11C and electrically connected to both of the components 10 in the second level 11B (and thereby indirectly electrically connected to both of the components 10 in the first level 11A). Referring to FIG. 6, a three-level electronic structure 50 includes three components 10 disposed in a first level 11A on the destination substrate 20. Two components 10 are stacked in a second level 11B on the three components 10 in first level 11A. Each of the components 10 in the second level 11B is electrically connected to two components 10 in the first level 11A. A further component 10 is disposed in a third level 11C and electrically connected to both the components 10 in the second level 11B.

The electronic structure 50 illustrated in FIG. 3 includes a component 10 in the second level 11B that is located directly above the component 10 in the first level 11A. In contrast, the electronic structures 50 illustrated in FIGS. 4 and 6 include components 10 in the second level 11B that are offset in at least one dimension from the components 10 in the first level 11A. In some embodiments of the present invention, a component 10 in the second level 11B is offset in two dimensions from the components 10 in the first level 11A. For example, a component 10 in a second level 11B can be offset a distance in both an x- and y-direction from a component 10 in a first level 11A such that at least one connection post 16 of the component in second level 11B is in contact with a component contact pad 19 of the component 10 in first level 11A.

Figure 7A:
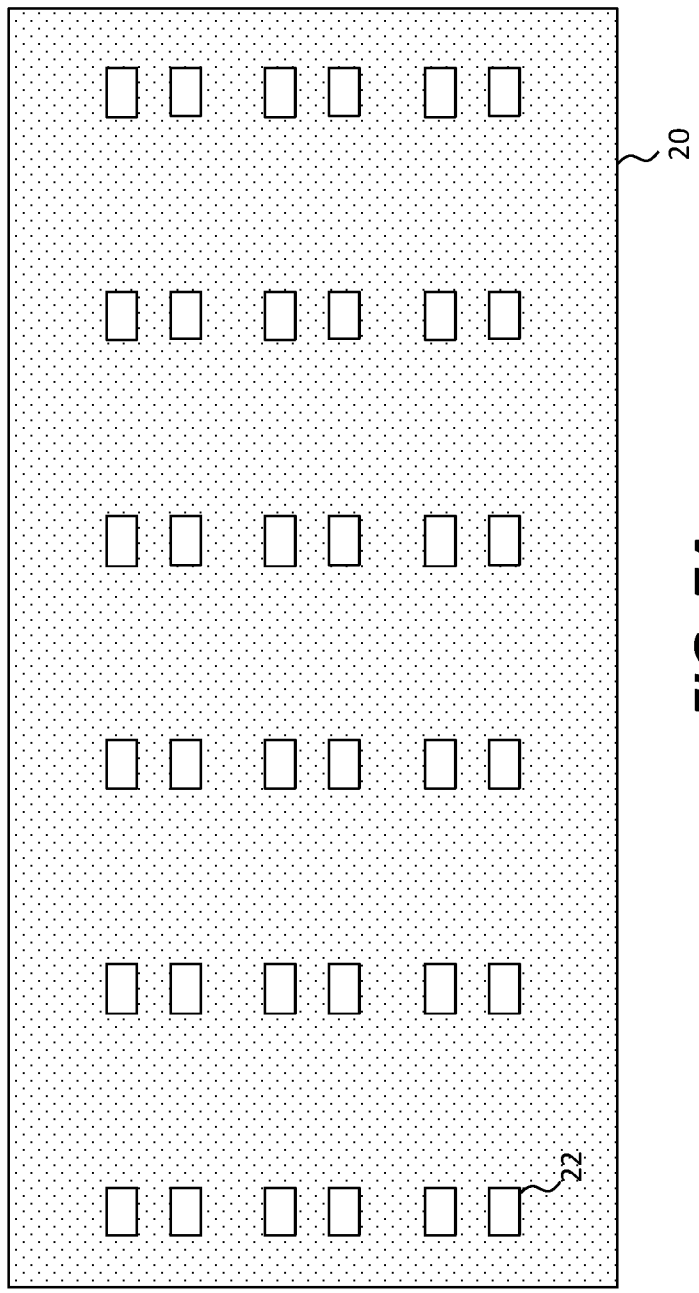
FIG. 7A is a plan view of a destination substrate according to an illustrative embodiment of the present invention.

FIG. 7A illustrates a destination substrate 20 with destination substrate contact pads 22 corresponding to a two-dimensional array of components 10 (not shown in the FIG. 7A) disposed on the destination substrate 20. FIG. 7B illustrates components 10 disposed (e.g., micro-transfer printed) onto the destination substrate 20 with the connection posts 16, component contact pads 19, and destination substrate contact pads 22 aligned in a direction orthogonal to a surface of the destination substrate 20. FIG. 7B corresponds to the electronic structure 50 of the partial cross section of FIG. 2. The component and destination contact pads 19, 22 and the connection posts 16 are indicated with dashed lines and the level of each component 10 is indicated on the component 10, first level 11A in the case of FIG. 7B. The components 10 are marked similarly in FIGS. 8-10.

Figure 8:
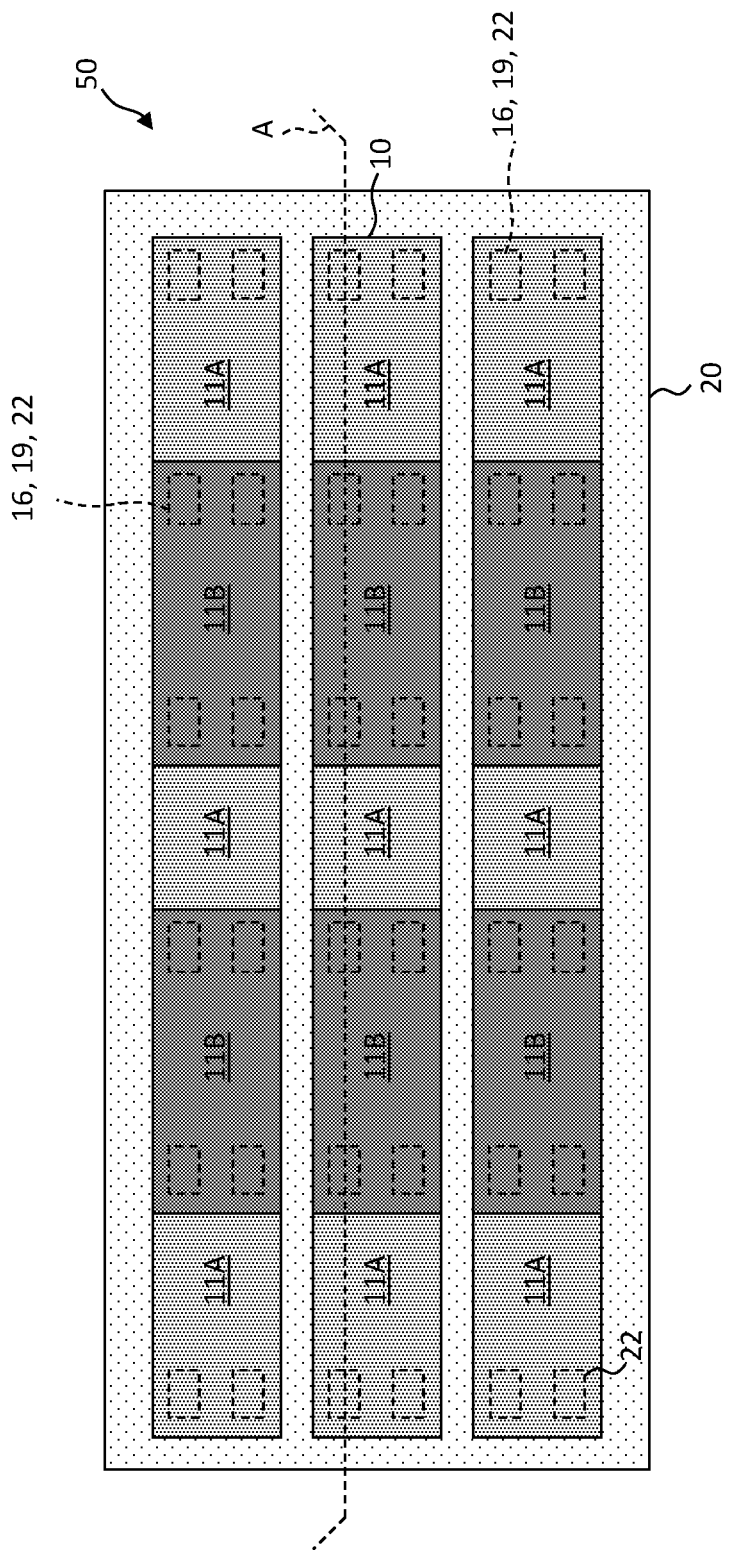
FIG. 8 is a plan view of the destination substrate of FIG. 8A with stacked printed components in various embodiments of the present invention corresponding in part to FIG. 4.

FIG. 4 is a partial cross section of FIG. 8 taken across cross section line A. In this illustrative embodiment, components 10 are electrically connected in both the first level 11A and the second level 11B. FIG. 6 is a partial cross section of FIG. 9 taken across cross section line B and includes components 10 that are electrically connected in the first level 11A, the second level 11B, and the third level 11C.

Figure 9:
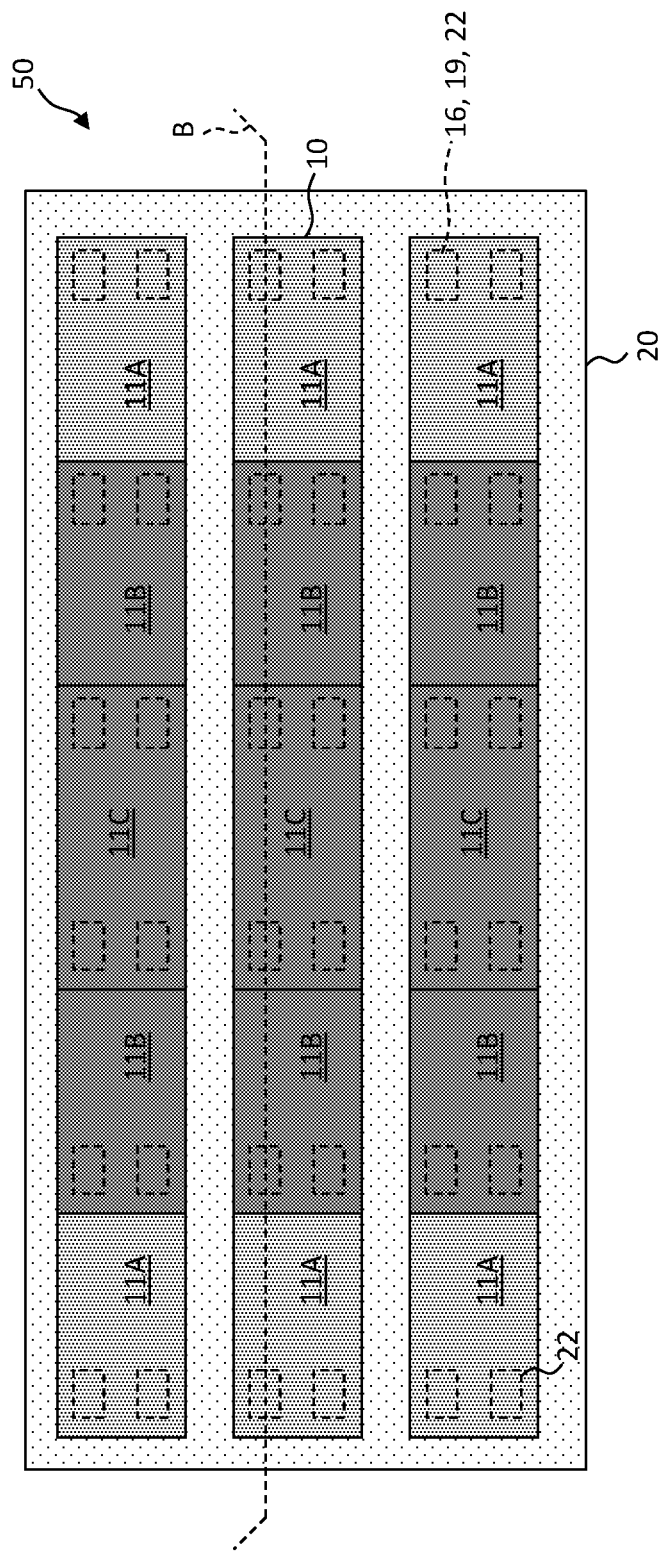
FIG. 9 is a plan view of the destination substrate of FIG. 8A with stacked printed components in various embodiments of the present invention corresponding in part to FIG. 6.
Figure 10:
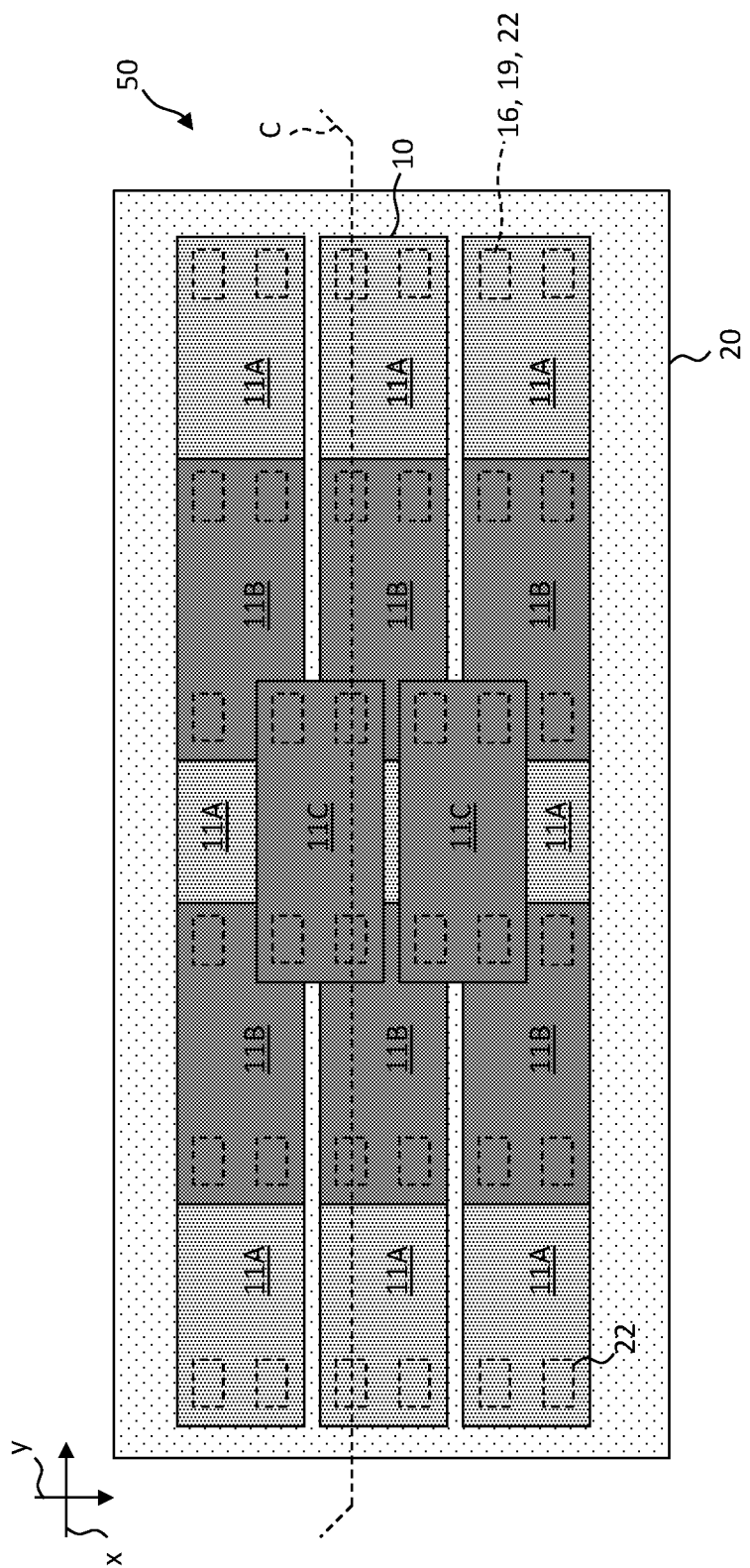
FIG. 10 is a plan view of the destination substrate of FIG. 8A with stacked printed components in various embodiments of the present invention corresponding in part to FIG. 6 is an alternative arrangement cross section.

In the illustrative embodiments of FIGS. 7B, 8, and 9, the components 10 in different levels are offset from each other in one dimension so that the second- or third-level components 10 are each electrically connected to two components 10. Referring to FIG. 10 in a figure with a slightly different scale and component 10 spacing, the components 10 in different levels (e.g., third level 11C and second level 11B) are offset from each other in two dimensions so that components 10 in a level (e.g., third level 11C) are each electrically connected to four components 10 in a different level (e.g., second level 11B). FIG. 6 also represents a partial cross section of FIG. 10 taken across cross section line C and a different portion of the component 10 in the third level 11C. In FIG. 10, components 10 in the third level 11C are offset in two dimensions (e.g., horizontal directions x and y) from the components 10 in the second level 11B. The components 10 in the second level 11B are offset in only one dimension (e.g., horizontal direction x) from the components 10 in the first level 11A. Thus, in some embodiments of the present invention, an electronic structure 50 includes a fourth micro-transfer printable electronic component 10 electrically connected to a printable electronic component 10 in a different layer than the fourth printable electronic component 10.

Different components 10 can have different sizes (in contrast to their same-sized representation in the figures), include different numbers of connection posts 16, or include different numbers of component contact pads 19. The number of electrically separate connection posts 16 can be different from the number of electrically separate component contact pads 19 in a component 10. Components 10 can comprise different materials, be made in different processes, and have different structures.

Figure 11:
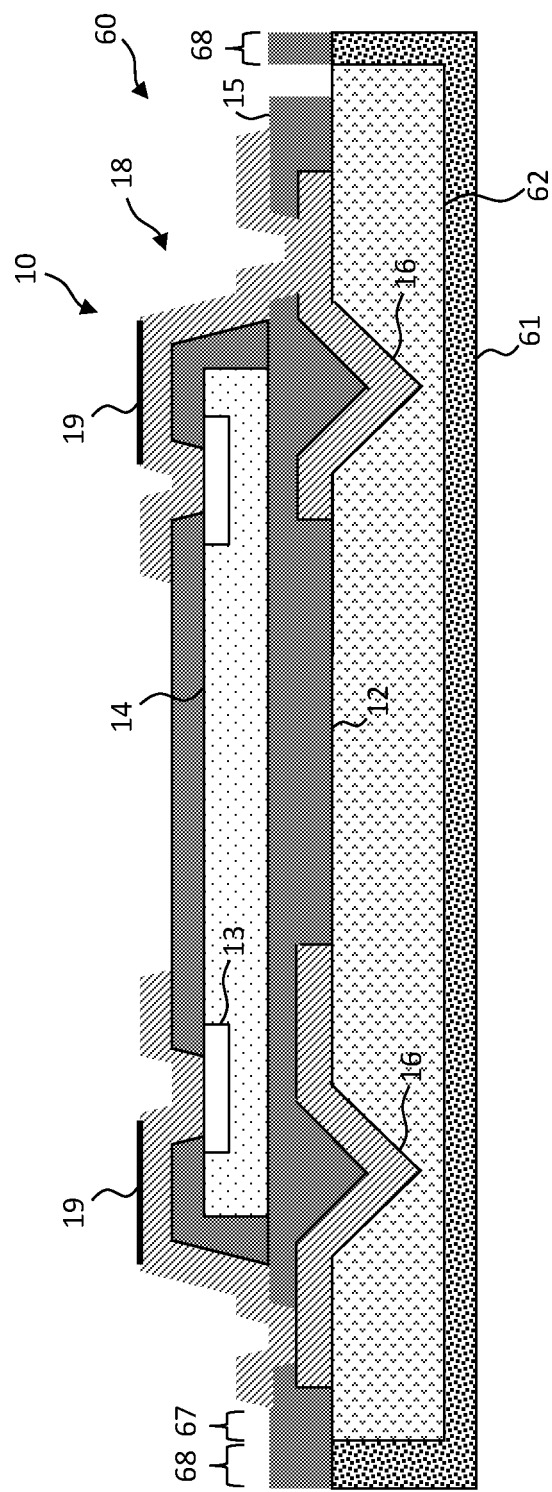
FIG. 11 is a cross section of a micro-transfer printable component source wafer in an illustrative embodiment of the present invention.

Components 10 in accordance with certain embodiments of the present invention can be micro-transfer printed from a micro-transfer printable component source wafer 60. An exemplary micro-transfer printable component source wafer is shown in FIG. 11. Referring to FIG. 11, an exemplary micro-transfer printable component source wafer 60 includes a component source wafer substrate 61 with one or more sacrificial portions 62 spaced apart by anchor 68 portions. At least one component 10 is disposed entirely over each sacrificial portion 62 and connected to at least one anchor 68 portion by one or more tethers 67. When the sacrificial portion 62 is etched to form a gap between the component 10 and the substrate of the component source wafer substrate 61, the component 10 can be micro-transfer printed from the component source wafer 60 to a destination substrate 20 by pressing a stamp 30 against the component 10 to break (e.g., fracture) or separate the one or more tethers 67, adhere the component 10 to the stamp 30, locate the stamp 30 in alignment with the destination substrate 20, adhere the component 10 to the destination substrate 20, and remove the stamp 30.

The substrate of the component source wafer substrate 61 can be silicon, glass, ceramic, plastic or another wafer material suitable for photolithographic processing. In some embodiments, a circuit 14 is an active circuit and a substrate 61 of the component source wafer is a semiconductor. In some embodiments, a circuit 14 is a light-emitting circuit (for example including a light-emitting diode) and a substrate of the component source wafer substrate 61 is sapphire or a compound semiconductor. In some embodiments, a circuit 14 is a passive circuit and a substrate of the component source wafer substrate 61 is glass, ceramic, or plastic.

Figure 13A:
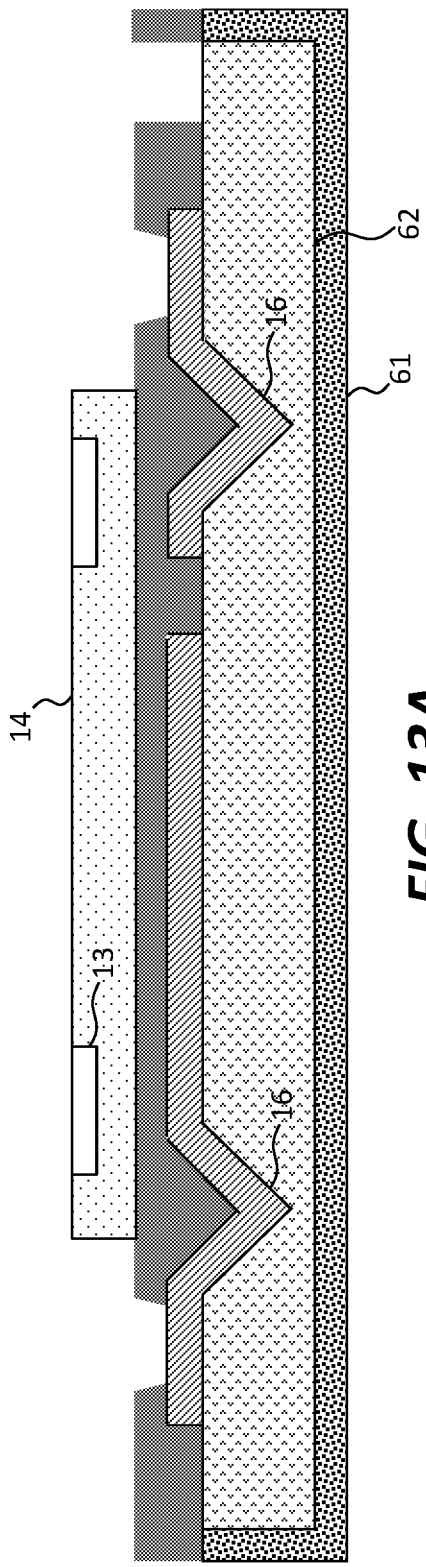
FIGS. 13A-13D are sequential cross sections illustrating a method of making an illustrative embodiment of the present invention.
Figure 13B:
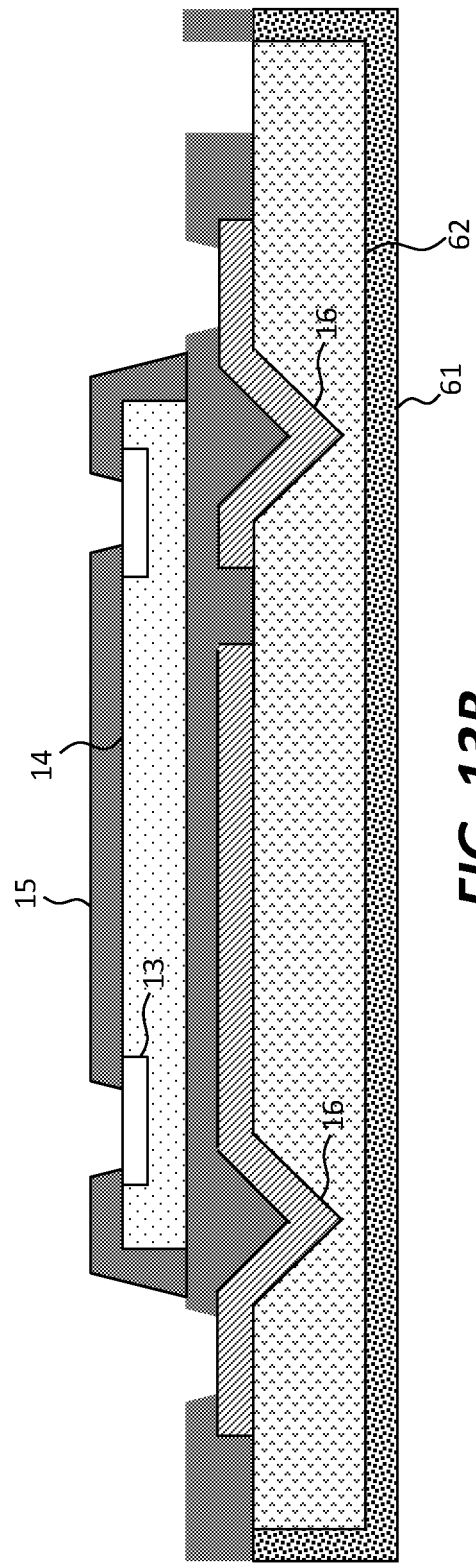
Figure 13C:
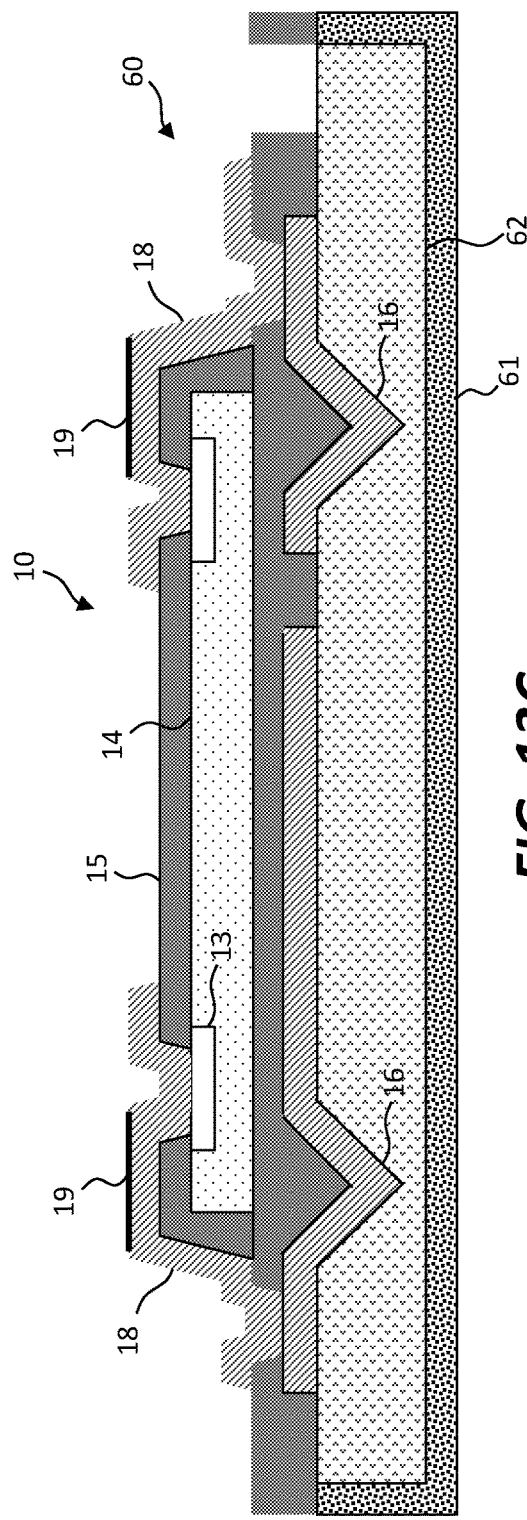
Figure 13D:
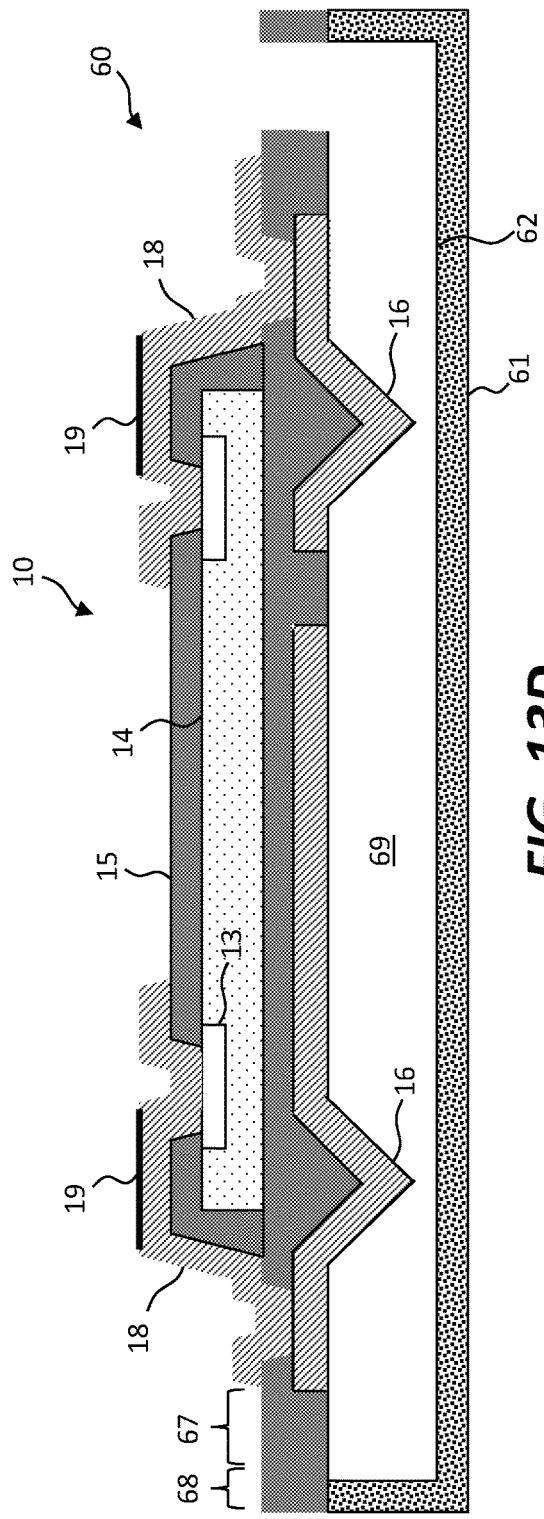

In various embodiments of the present invention, a component source wafer substrate 61 and sacrificial portion 62 include various materials. In some embodiments, a substrate 61 of the component source wafer 60 is anisotropically etchable (for example silicon {1 1 1}) and each sacrificial portion 62 is a designated portion of the component source wafer substrate 61. In some embodiments, each sacrificial portion 62 comprises sacrificial material (e.g., silicon dioxide) that is differentially etchable from the component source wafer substrate 61. In some embodiments, sacrificial portion 62 is an empty space forming a gap (as shown in FIG. 13D) between the component 10 and the component source wafer substrate 61 made by etching the sacrificial portion 62.

Figure 12A:
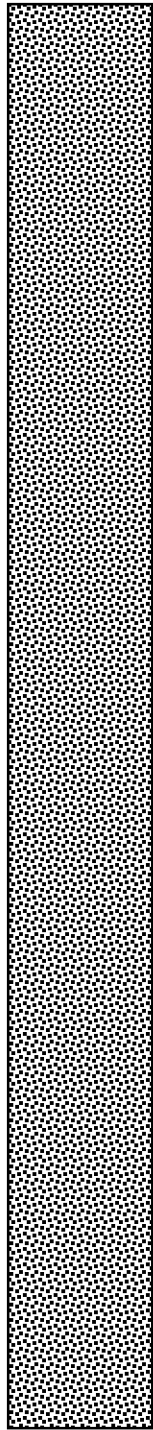
Figure 12B:
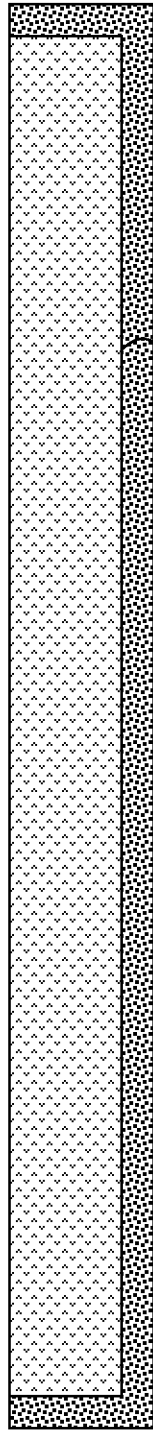
Figure 12C:
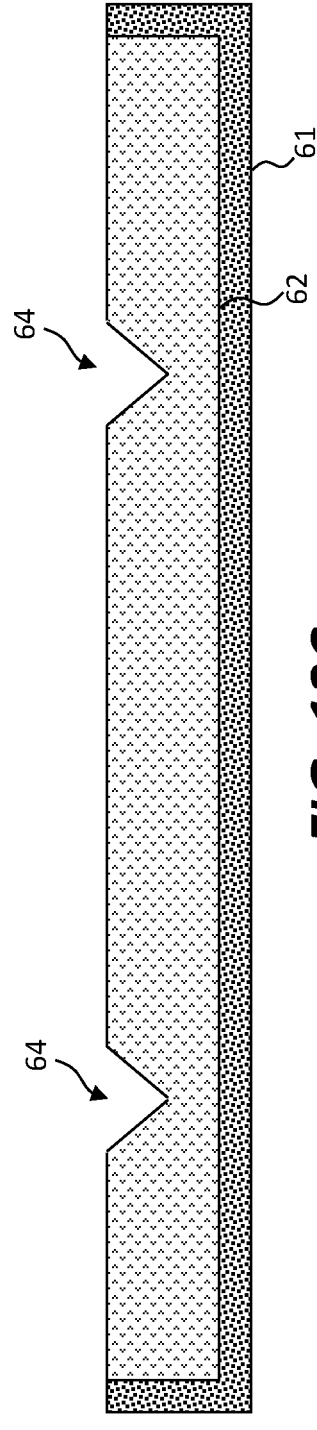

Illustrative methods of making certain embodiments of the present invention are illustrated in FIGS. 12A-12F, 13A-13D, and 14A-14H. Referring to FIG. 12A, a component source wafer substrate 61 is provided and sacrificial portions 62 patterned or designated in the component source wafer substrate 61 (as shown in FIG. 12B). Forms 64 such as pyramidal depressions are etched into the sacrificial portions 62 (as shown in FIG. 12C). The component source wafer substrate 61 can be, for example, a silicon {100} wafer and can be etched by any combination of dielectric hard masks, photolithography, mask etching, and anisotropic silicon wet etching with, for example KOH or TMAH, or dry etching. An electrically conductive layer 66 (e.g., forming a metal electrically conductive connection post 16) is patterned over the forms 64 and the sacrificial layer 62 (as shown in FIG. 12D), for example using photolithographic materials and methods. The layer 66 of conductive material is deposited, for example with evaporation, e-beam deposition, sputtering, or CVD, and patterned by etching through a patterned photo-resist mask, to form connection posts 16 at least in the forms 64 and optionally also on the planar surface of the component source wafer substrate 61. Soft metals can be used, such as gold, silver, tin, solders. Hard materials can be used, such as Ti, W, Mo, Ta, Al, or Cu.

Referring to FIG. 12E, a dielectric structure 15 is patterned over the electrically conductive layer 66 and connection posts 16. Optionally, the dielectric structure 15 is a planarizing layer. For example, an inorganic dielectric such as silicon dioxide or silicon nitride, or an organic insulator such as a polymer or a curable polymer, resin or epoxy is coated over the patterned layer 66 of electrically conductive material (including the connection posts 16) and the planar surface of the component source wafer substrate 61 and then patterned to form vias exposing portions of the electrically conductive layer 66 (as shown in FIG. 12F).

This generic process can be used to make a variety of components 10 having different circuits 14 and having differently patterned conductive layers 66. Referring to FIG. 13A, a component 10 having an active circuit 14 can be made by micro-transfer printing a circuit 14 from a circuit source wafer (e.g., an integrated circuit chiplet). In some embodiments, a circuit 14 is constructed on or in the sacrificial portion 62 using integrated circuit methods (not shown). In some embodiments, an active circuit 14 can be optionally insulated with another dielectric structure 15 and vias patterned to expose the circuit contact pads 13 of the circuit 14 (as shown in FIG. 13B). Referring to FIG. 13C, electrodes 18 (for example metal or metal oxide electrical conductors) are deposited (for example evaporated or sputtered) and patterned to electrically connect through the vias to the circuit contact pads 13 and the connection posts 16. Useful conductive materials include solder, tin, aluminum, gold, silver and other metals or metal alloys. Electrodes 18 can be made to extend slightly above the surface of the dielectric structure 15 to facilitate contact with the circuit contact pads 13.

Component contact pads 19 can be specially constructed (for example as a metallized area) or simply be designated portions of the electrodes 18. Referring to FIG. 13D, sacrificial portions 62 are etched to form a gap 69 or empty space between components 10 and a component source wafer substrate 61 to form a micro-transfer printable component source wafer 60 with tethers 67 connecting the components 10 to the anchors 68. Etchants can include an anisotropic etch, an aqueous base etchant, KOH, or TMAH to form the gap 69 and anchors 68 in the component source wafer 60 connected by tethers 67 to the printable component 10. In some embodiments, second or third dielectric structures 15 or layers are provided to facilitate the definition of the printable component 10, the anchors 68, and the tethers 67. In some embodiments, a circuit 14 is constructed on or in a sacrificial portion 62 using integrated circuit methods to form a structure, for example the structure of FIG. 13A.

Figure 14A:
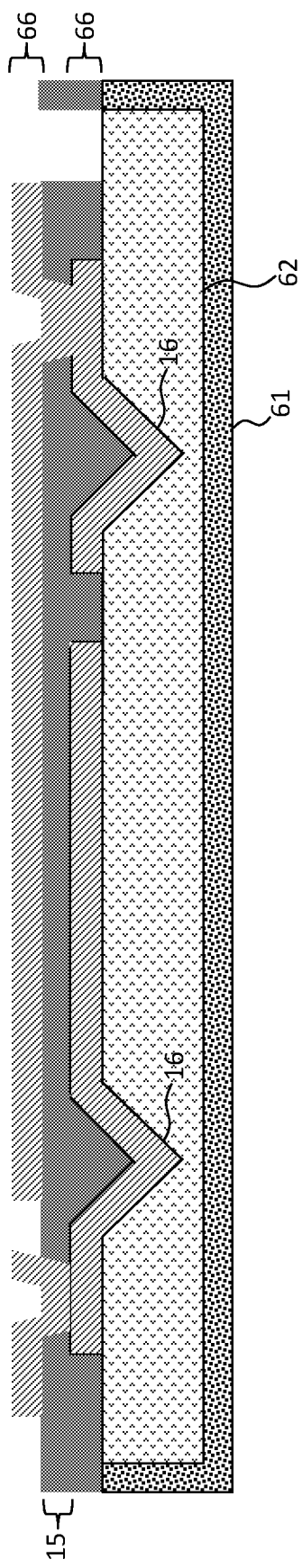
FIGS. 14A-14H are sequential cross sections illustrating a method of making another illustrative embodiment of the present invention.
Figure 14B:
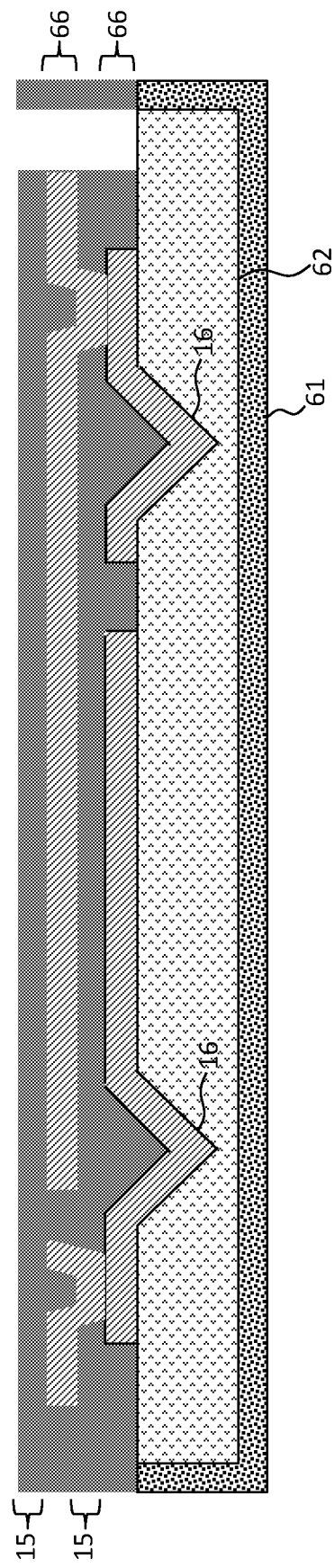
Figure 14C:
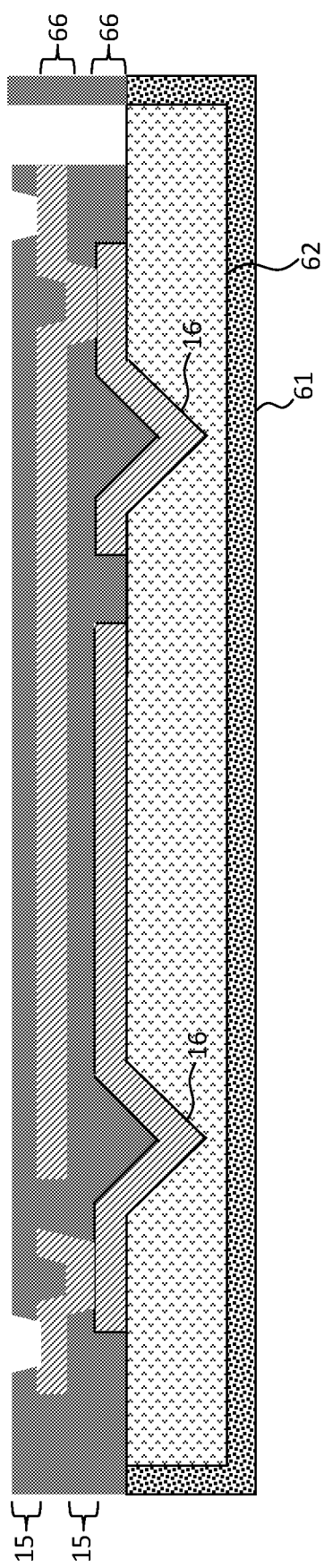
Figure 14D:
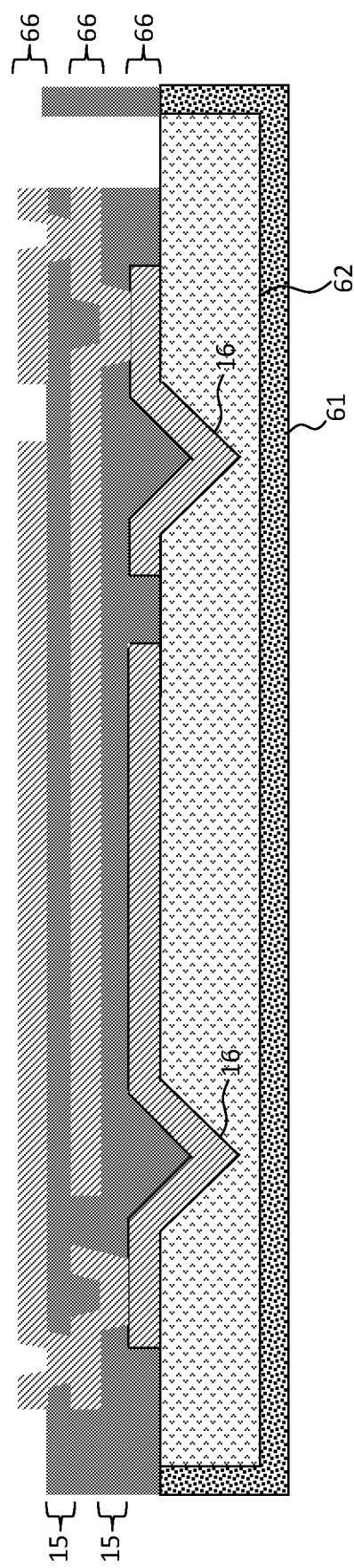
Figure 14E:
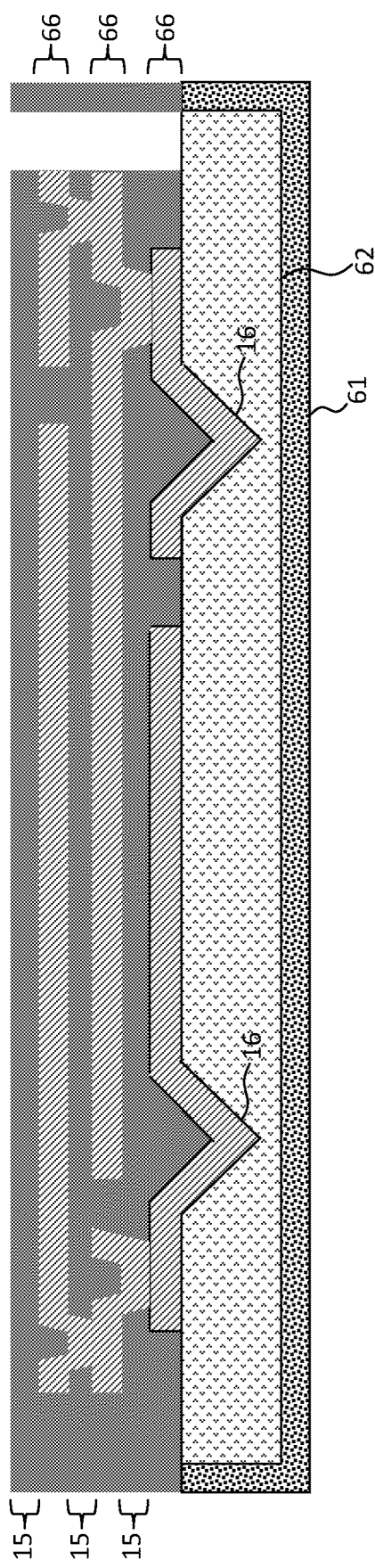
Figure 14F:
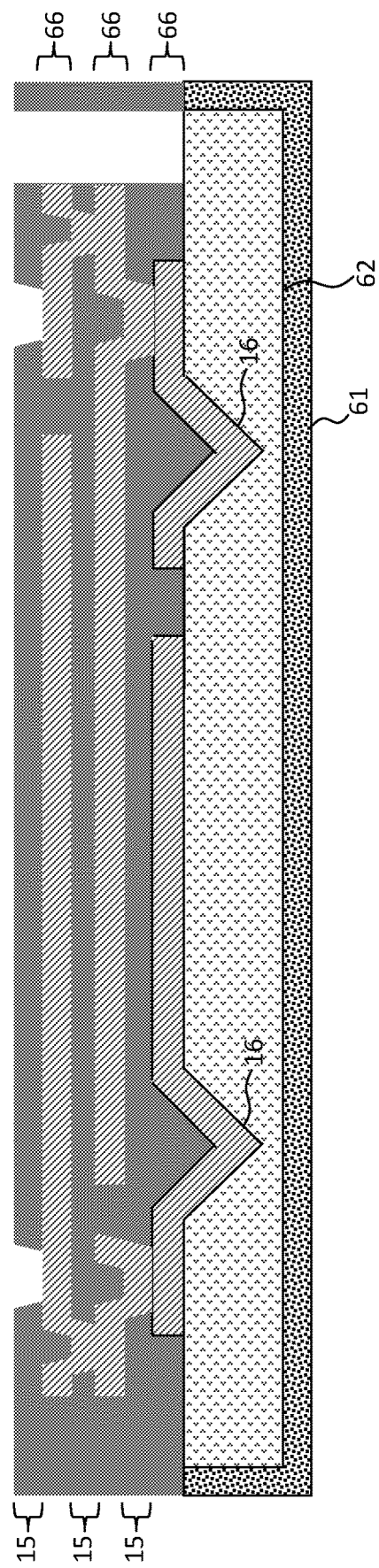
Figure 14G:
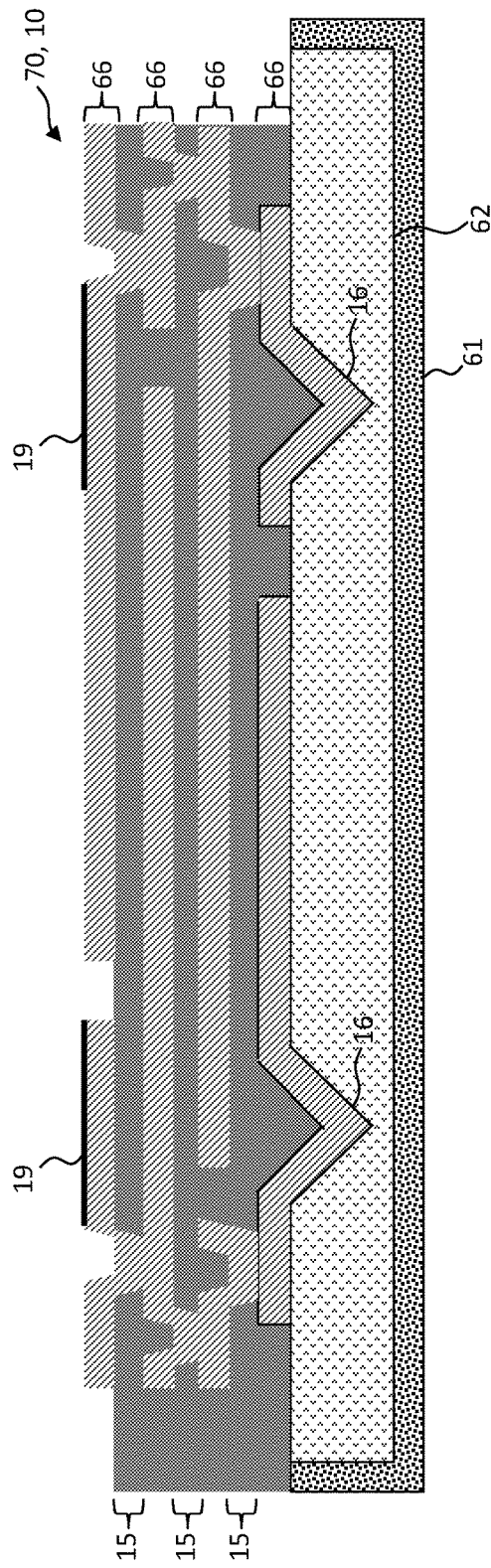
Figure 14H:
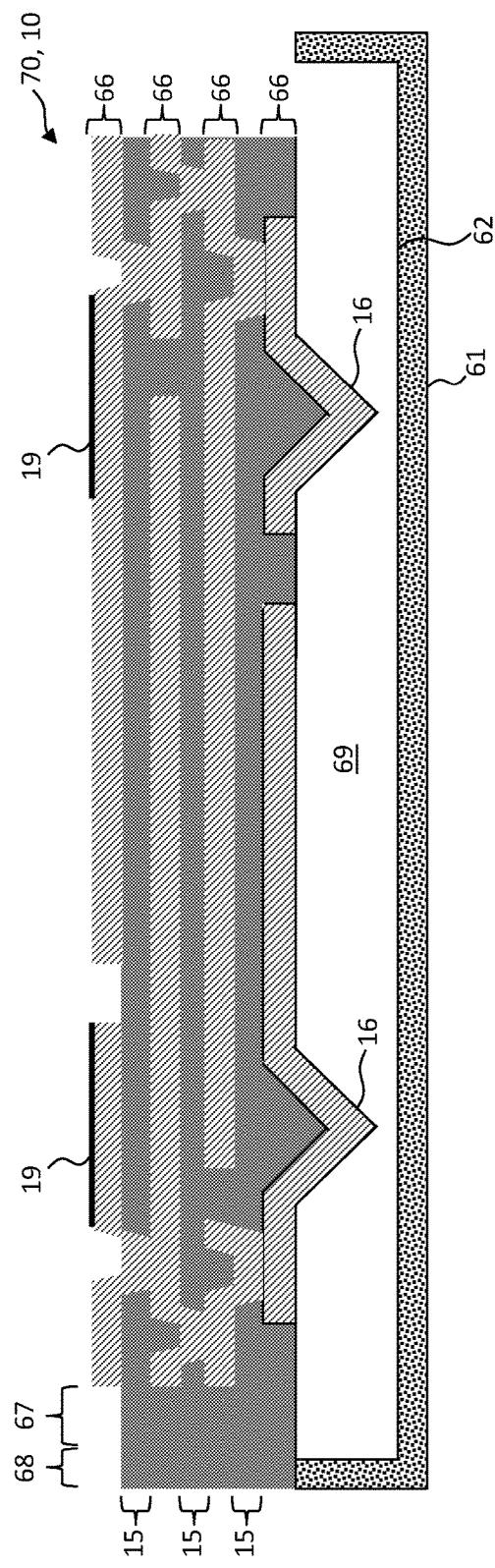

Referring to FIGS. 14A-14H, a component 10 having a passive circuit 14 (in this case a multi-layer capacitor 70) is made by forming alternating dielectric layers 15 and electrically conductive layers 66 (e.g., metal plates). Alternate metal plates are electrically connected in common to provide terminals (e.g., electrodes 18) for electrically connecting to the capacitor 70. As shown in FIG. 14A, a metal layer is patterned and connected to one of the connection posts 16 through a via. A dielectric layer 15 is then deposited (as shown in FIG. 14B) and then patterned (as shown in FIG. 14C) with vias through which another metal layer is patterned and electrically connected to another connection post 16 (as shown in FIG. 14D). Another dielectric layer is deposited (as shown in FIG. 14E) and patterned with vias (as shown in FIG. 14F) and a metal layer patterned (as shown in FIG. 14 G). This process of providing alternating dielectric layers 15 and alternately connected patterned metal electrically conductive layers 66 can be repeated as often as desired to form as many layers in the capacitor 70 component 10 as are wanted. The last patterned metal electrically conductive layer 66 can provide component contact pads 19 (e.g., disposed on the exposed patterned metal layer) (as shown in FIG. 14G). Referring to FIG. 14H, sacrificial portions 62 are etched to form a gap 69 or empty space between the capacitor 70 components 10 and the component source wafer substrate 61 to form the micro-transfer printable component source wafer 60 with tethers 67 connecting the components 10 to the anchors 68.

Figure 15:
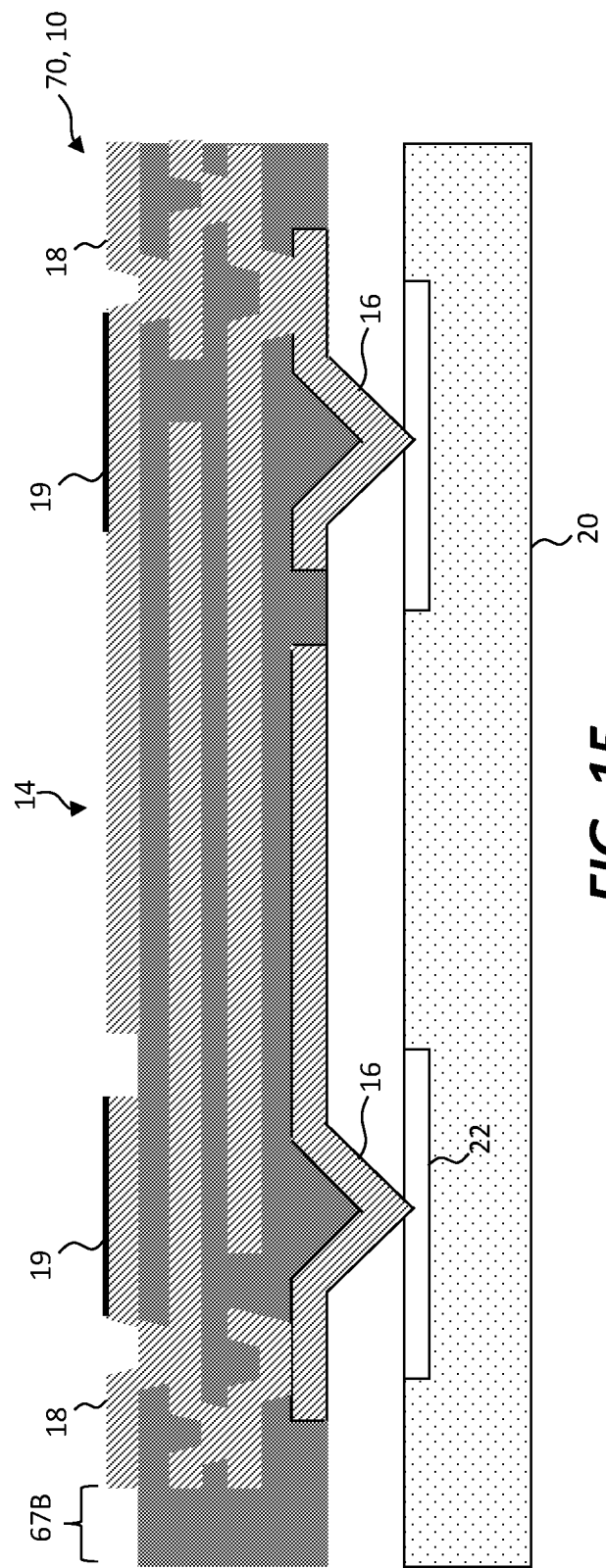
FIG. 15 is a cross section of a printed component on a destination substrate in an illustrative embodiment of the present invention.

The capacitor components 10, 70 of the micro-transfer printable component source wafer 60 can be micro-transfer printed to a destination substrate 20, as shown in FIG. 15, with connection posts 16 electrically connected to destination substrate contact pads 22 of the destination substrate 20, just as with the component 10 with an active circuit 14 shown in FIG. 2. Similarly, additional capacitor components 10, 70 of a micro-transfer printable component source wafer 60 can be micro-transfer printed to form a stack of electrically connected capacitor 70 components 10 in first and second levels 11A and 11B, as shown in FIG. 16 and corresponding to the illustrative embodiment shown in FIG. 3. In this arrangement, the capacitance of the electronic structure 50 is at least twice that of either of the capacitor components 10, 70 by itself.

Figure 17:
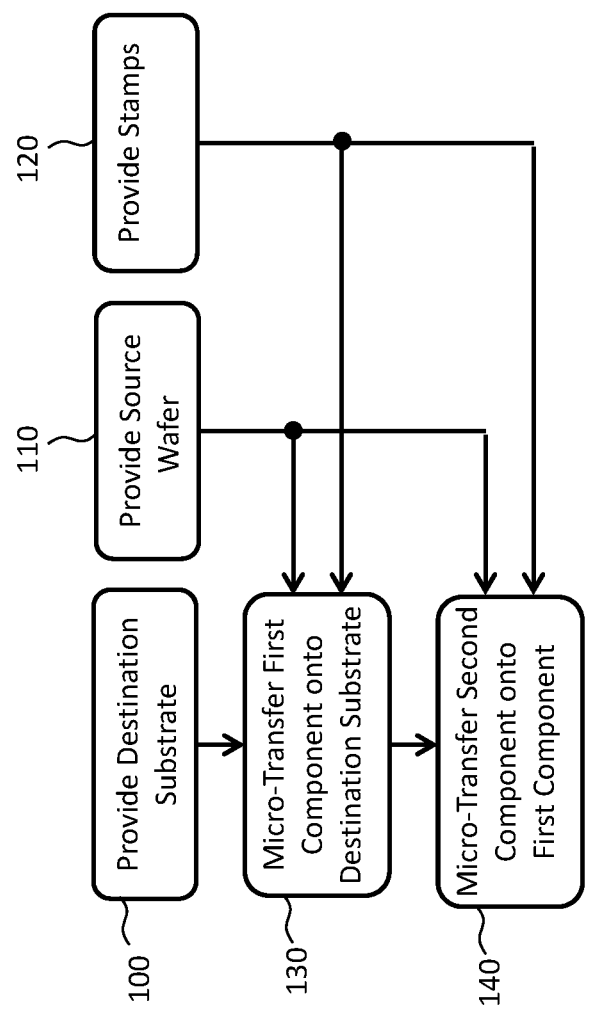
FIGS. 17 and 18 are flow charts illustrating illustrative methods of the present invention useful for making micro-transfer printed electronic structures.
Figure 18:
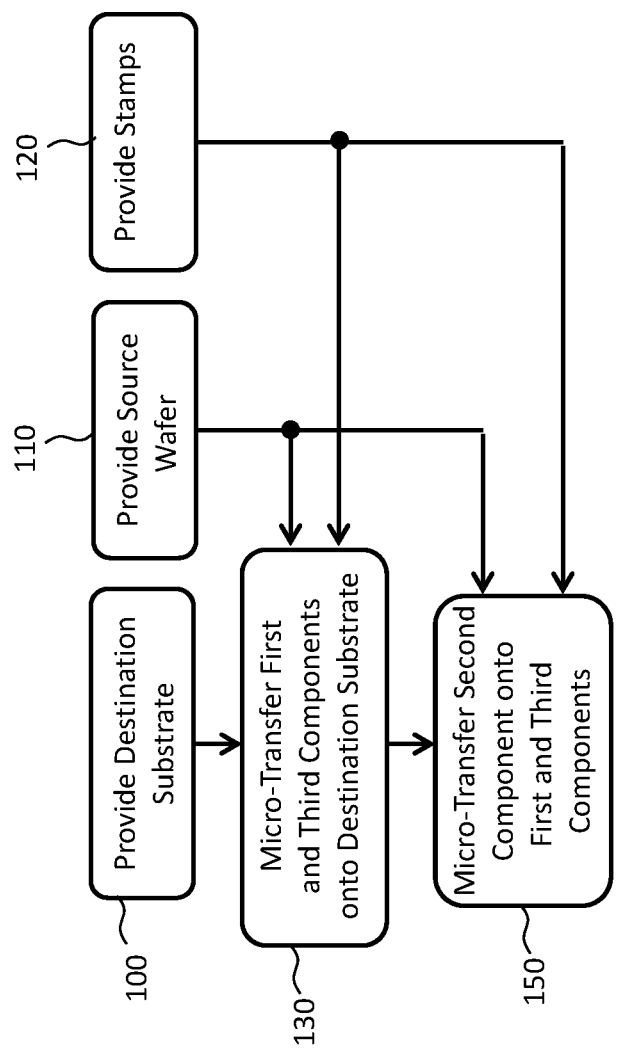
Figure 19:
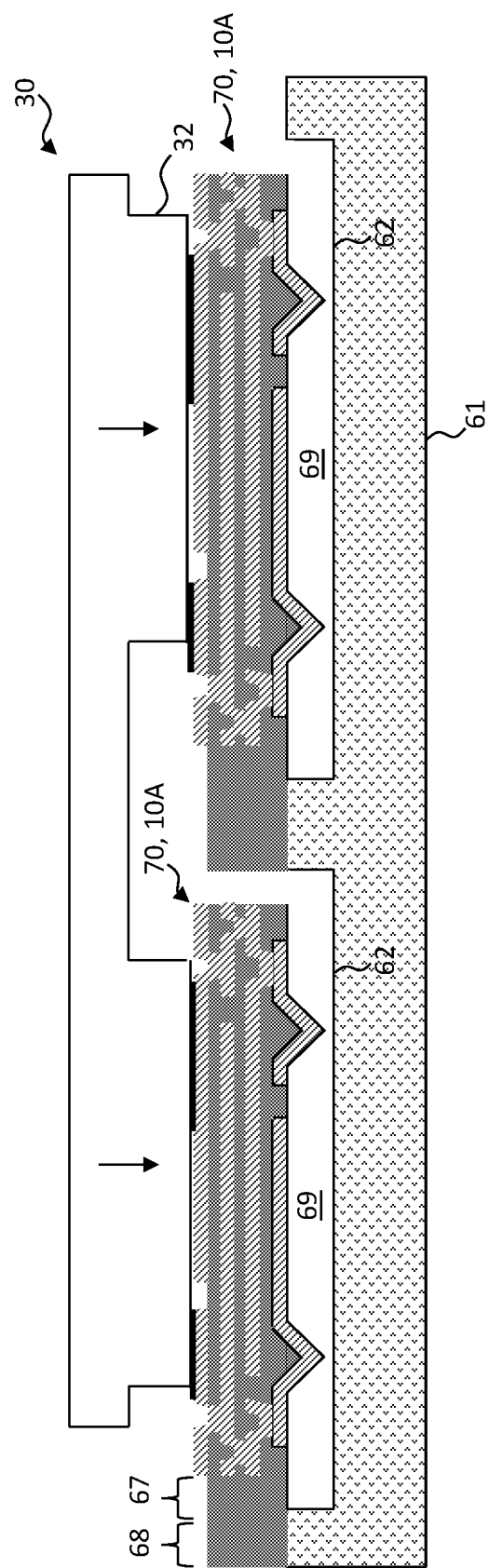
FIGS. 19-21 are cross sections illustrating steps in an illustrative method of making an illustrative embodiment of the present invention.
Figure 20:
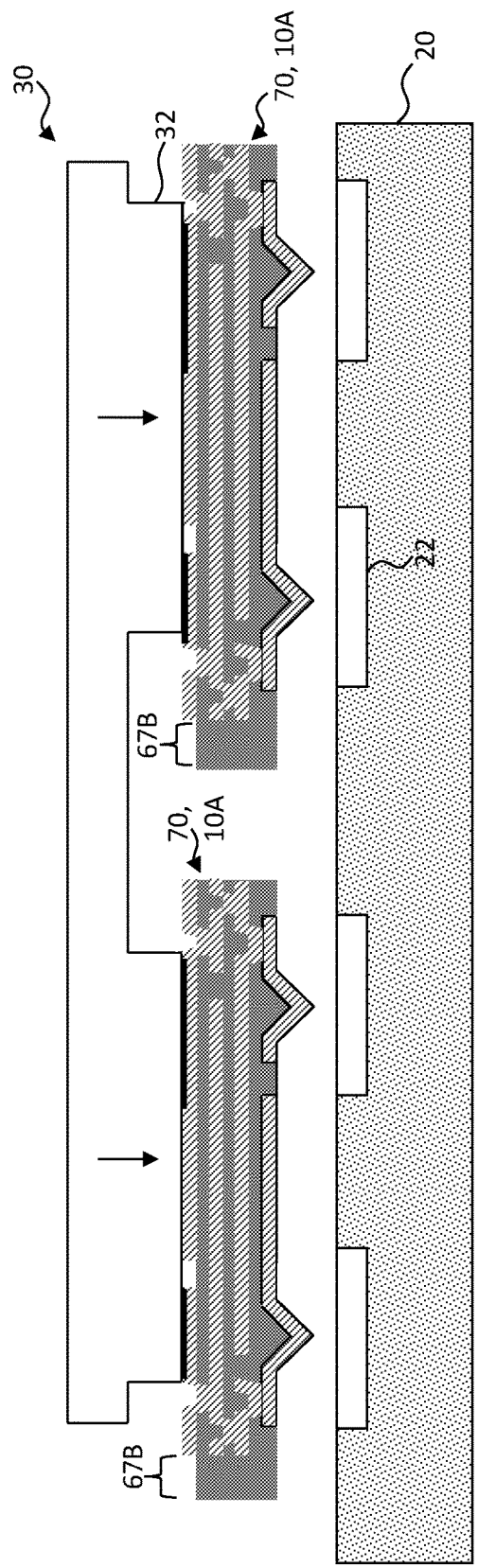
Figure 21:
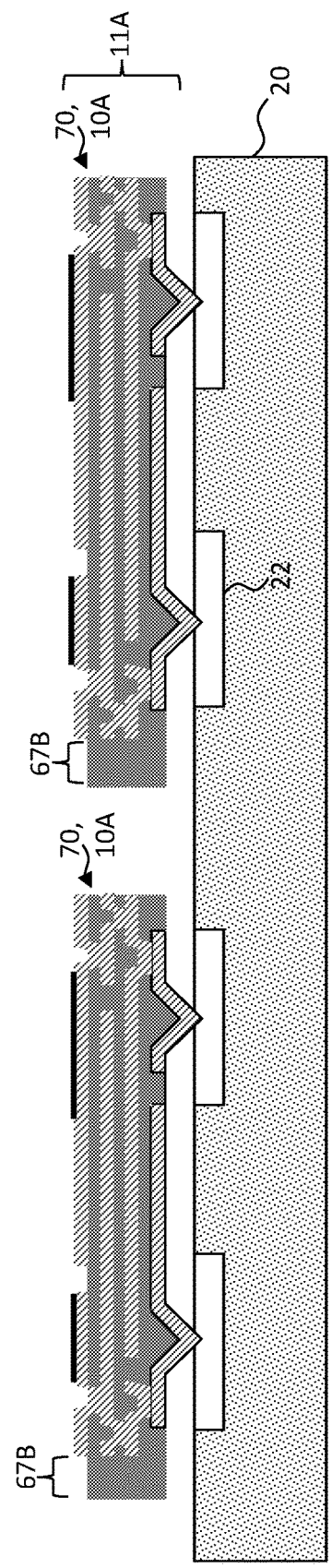

Referring next to the flow charts of FIGS. 17 and 18 and the cross sections of FIGS. 16, and 19-22, an exemplary method of making a micro-transfer printed electronic structure 50 in accordance with certain embodiments of the present invention includes providing a destination substrate 20 having one or more destination substrate contact pads 22 in step 100, providing a micro-transfer printable component source wafer 60 having a plurality of micro-transfer printable electronic components 10 in step 110, and providing one or more micro-transfer printing stamps 30 in step 120. The stamp 30 is aligned with the micro-transfer printable component source wafer 60 so that one or more stamp pillars 32 are each aligned with one or more first components 10A of the micro-transfer printable component source wafer 60. The stamp 30 pillars 32 are pressed against the corresponding first components 10A to break the tethers 67 forming broken or separated tethers 67B connecting the first components 10A to the anchors 68, as shown in FIG. 19. The first components 10A adhere to the pillars 32 and the stamp 30 is relocated in alignment with the destination substrate 20 so that connection posts 16 of the first components 10A are aligned with destination substrate contact pads 22 as shown in FIG. 20. The first components 10A and connection posts 16 are pressed against the destination substrate 20 and destination substrate contact pads 22 to adhere the first components 10A to the destination substrate 20 and electrically connect connection posts 16 to destination substrate contact pads 22. The stamp 30 is removed in step 130, as shown in FIG. 21, to micro-transfer print the first components 10A from the micro-transfer printable component source wafer 60 to the destination substrate 20 thereby forming a first level 11A of first components 10A. If an adhesive layer 24 is present, the adhesive can be cured before or after the stamp 30 is removed (e.g., after step 130).

Referring to the illustrative embodiment shown in FIG. 16, in step 140 at least one second component 10B is micro-transfer printed from the micro-transfer printable component source wafer 60 onto the first components 10A using a stamp 30. The stamp 30 can be a different stamp 30 in steps 130 and 140, since the arrangement and locations of the first and second components 10A, 10B over the destination substrate 20 are different. At least one connection post 16 of the second component 10B is aligned and in electrical contact with at least one component contact pad 19 of the first component 10A.

Figure 22:
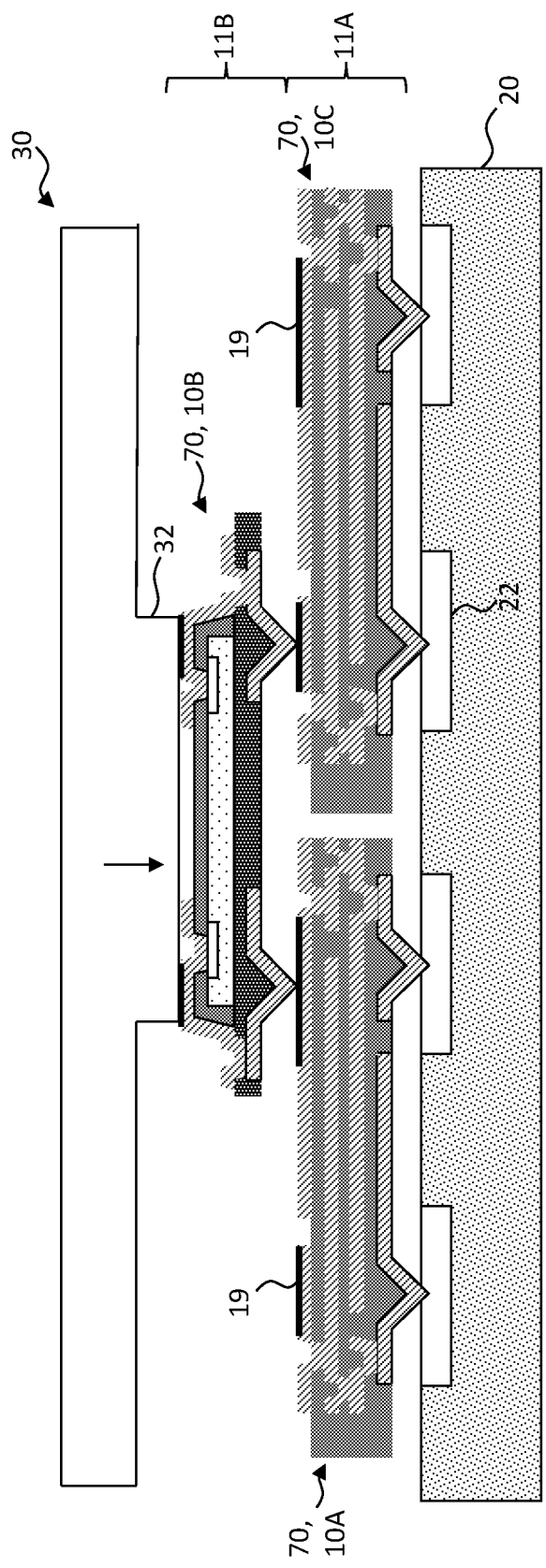
FIG. 22 is an illustration of at least one second component micro-transfer printed from a micro-transfer printable component source wafer onto one or more first and third components using a stamp in an illustrative embodiment of the present invention.

Referring to the illustrative embodiment shown in FIG. 22, in step 150 at least one second component 10B is micro-transfer printed from the micro-transfer printable component source wafer 60 onto one or more first and third components 10A, 10C using a stamp 30. The stamp 30 can be different in steps 130 and 140, as shown in FIG. 22, since the arrangement and locations of the first, second, and third components 10A, 10B, 10C over the destination substrate 20 are different. At least one connection post 16 of the second component 10B is aligned and in electrical contact with at least one component contact pad 19 of the first component 10A and at least one connection post 16 of the second component 10B is aligned and in electrical contact with at least one component contact pad 19 of the third component 10C. As shown in FIG. 22, the first and second components 10A, 10B can be different components 10, as can the first and third components 10A, 10C. Thus, according to some embodiments of the present invention, at least a third component 10C is micro-transfer printed (also in step 130) from a micro-transfer printable component source wafer 60 to the destination substrate 20 using a stamp 30 before micro-transfer printing the second component 10B. At least one connection post 16 of the third component 10C is aligned and in electrical contact with at least one destination substrate contact pad 22 and the second component 10B is micro-transfer printed so that at least one connection post 16 of the second component 10B is aligned and in electrical contact with at least one component contact pad 19 of the third component 10C. The various first, second, and third components 10A, 10B, 10C can be the same or different and can be micro-transfer printed from the same or different micro-transfer printable component source wafers 60.

Figure 23:
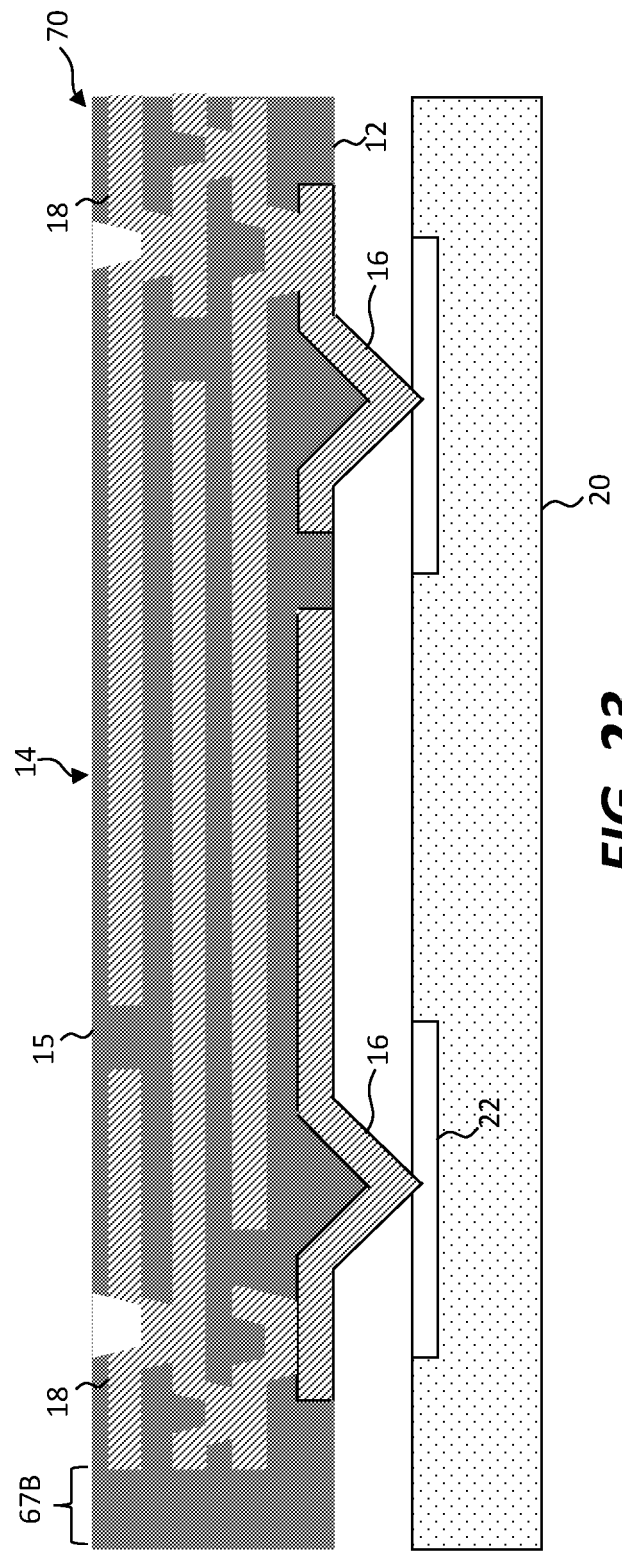
FIG. 23 is a cross section of a capacitive printed component on a destination substrate in an illustrative embodiment of the present invention.

In some embodiments of the present invention, a capacitive micro-transfer printable electronic component 10 does not necessarily include a component contact pad 19. An illustrative embodiment without a separate contact pad component 19 is shown in FIG. 23. In this embodiment, the capacitive component 10 includes a component substrate 12 and a plurality of capacitors 70 formed in or on the component substrate 12. The plurality of capacitors 70 are electrically connected in parallel and have first and second capacitor terminals for providing electrical connection to the capacitor 70. The first and second capacitor terminals can be the electrodes 18. First and second electrically conductive connection posts 16 protrude from the component substrate 12. The first connection post 16 is electrically connected to the first capacitor terminal and the second connection post 16 is electrically connected to the second capacitor terminal separately from the first terminal to form a capacitor 70 whose connection posts 16 are electrically connected to the capacitor terminals. In some embodiments, capacitors 70 are horizontal capacitors and can be formed in or on a side of the component substrate 12 opposite the connection posts 16 or generally within the component substrate 12. In some embodiments, capacitors 70 are vertical capacitors, for example deep-trench capacitors.

A component 10 can be an active component, for example including one or more active elements such as electronic transistors or diodes or light-emitting diodes and photodiodes that produce an electrical current in response to ambient light. In some embodiments, a component 10 is a passive component, for example including one or more passive elements such as resistors, capacitors, or conductors. In some embodiments, a component 10 is a compound component 10 that includes both active and passive elements. A component 10 can be a semiconductor device having one or more semiconductor layers 11, such as an integrated circuit. A component 10 can be an unpackaged die. In some embodiments, a component 10 is a compound element having a plurality of active or passive elements, such as multiple semiconductor devices with separate substrates, each with one or more active elements or passive elements, or both. In certain embodiments, a plurality of elements is disposed and interconnected on a compound element substrate separate from the substrates of any semiconductor or other device or structure. The compound element can be micro transfer printed itself after the elements have been arranged thereon. Components 10 can be electronic processors, controllers, drivers, light-emitting diodes, photodiodes, light-control devices, or light-management devices.

Components 10 can include active elements such as electronic circuits 14 formed using lithographic processes and can include passive elements such as electrical connections (e.g., wires) to component contact pads 19 and connection posts 16. In certain embodiments, component contact pads 19 are planar electrical connections formed on a process side of the component 10 (e.g., a process side of a micro-transfer printable component source wafer 60). Such component contact pads 19 are typically formed from metals such as aluminum or polysilicon using masking and deposition processes used in the art. In certain embodiments, component contact pads 19 are electrically connected to a circuit 14 with wires or electrodes 18. In some embodiments, component contact pads 19 are directly electrically connected to a circuit 14 without intervening wires. In some embodiments, component contact pads 19 and a circuit 14, together with other functional structures formed in the active layer on the component source wafer 60, make up a component 10 or small integrated circuit chiplet of the component 10.

In some embodiments of the present invention, components 10 are small integrated circuits, for example chiplets, having a thin substrate with a thickness of only a few microns, for example less than or equal to 25 microns, less than or equal to 15 microns, or less than or equal to 10 microns, and a width or length of 5-10 microns, 10-50 microns, 50-100 microns, or 100-1000 microns. Such chiplet components 10 can be made in a semiconductor component source wafer 60 (e.g., a silicon or GaN wafer) having a process side and a back side used to handle and transport the wafer. In certain embodiments, components 10 are formed using lithographic processes in an active layer on or in the process side of the component source wafer 60. In certain embodiments, an empty release layer space (gap 69) is formed beneath the components 10 with tethers 67 connecting the components 10 to anchors 68 in the component source wafer 60 in such a way that pressure applied against the components 10 breaks the tethers 67 to make broken (e.g., fractured) tether 67B and release the components 10 from the component source wafer 60. Methods of forming such structures are described, for example, in the paper *AMOLED Displays using Transfer-Printed Integrated Circuits* and U.S. Pat. No. 8,889,485 referenced above. Lithographic processes for forming components 10 in a component source wafer 60, for example transistors, wires, and capacitors, can be found in the integrated circuit art.

According to various embodiments of the present invention, a native source wafer can be provided with the components 10, release layer, tethers 67, and connection posts 16 already formed, or they can be constructed as part of a process in accordance with some embodiments of the present invention.

In certain embodiments, connection posts 16 are structures that provide electrical connections that extend generally perpendicular to the surface of a component substrate 12. Such connection posts 16 can be formed from metals such as aluminum, titanium, tungsten, copper, silver, gold, or other conductive metals. Connection posts 16 can be formed by repeated masking and deposition processes that build up three-dimensional structures. In some embodiments, the connection posts 16 are made of one or more high elastic modulus metals, such as tungsten. As used herein, a high elastic modulus is an elastic modulus sufficient to maintain the function and structure of the connection post 16 when pressed into a destination substrate contact pad 22.

In certain embodiments, electrodes 18 include patterned metal layers forming component contact pads 19. Component contact pads 19 can be made using integrated circuit photolithographic methods. Likewise, connection posts 16 can be made by etching one or more layers of metal evaporated or sputtered on a component 10. In some embodiments, as illustrated in FIGS. 12A-12F, such structures can be made by forming a layer above the component 10 surface, etching a well into the surface, filling it with a conductive material such as metal, and then removing the layer. In some embodiments, connection posts 16 are electrically connected to a circuit 14 and the connection posts 16 and the circuit 14, together with other functional active or passive structures formed in the active layer on the source wafer, make up a component 10.

Connection posts 16 can have a variety of aspect ratios and typically have a peak area smaller than a base area. Connection posts 16 can have a sharp point for embedding in or piercing destination substrate contact pads 22. Components 10 with protruding connection posts 16 generally are discussed in U.S. Pat. No. 8,889,485, the disclosure of which is hereby incorporated by reference herein in its entirety.

Destination substrate contact pads 22 can be made of a relatively soft metal, such as tin, solder, or tin-based solder, to assist in forming good electrical contact with connection posts 16 and adhesion with components 10. As used herein, a soft metal may refer to a metal into which a connection post 16 can be pressed to form an electrical connection between the connection post 16 and a destination substrate contact pad 22 or the component contact pads 19. In this arrangement, destination substrate contact pad 22 or component contact pad 19 can plastically deform and flow under mechanical pressure to provide a good electrical connection between the connection post 16 and the destination substrate contact pad 22 or the component contact pad 19.

In some embodiments of the present invention, connection posts 16 can include a soft metal and destination substrate contact pads 22 or component contact pads 19 can include a high elastic modulus metal. In this arrangement, connection posts 16 can plastically deform and flow under mechanical pressure to provide a good electrical connection between the connection post 16 and the destination substrate contact pads 22 or the component contact pads 19.

If an optional adhesive layer 24 is formed on a destination substrate 20, connection posts 16 can be driven through the adhesive layer 24 to form an electrical connection with destination substrate contact pads 22 beneath the adhesive layer 24. In certain embodiments, an adhesive layer 24 can be cured to more firmly adhere components 10 to a destination substrate 20 and maintain a robust electrical connection between the connection posts 16 and destination substrate contact pads 22 in the presence of mechanical stress. In certain embodiments, an adhesive layer 24 can undergo some shrinkage during the curing process that can further strengthen the electrical connectivity and adhesion between a connection post 16 and a destination substrate contact pad 22 or a component contact pad 19. In some embodiments of the present invention, an adhesive layer 24, for example a curable adhesive layer 24, is coated over a first layer 11A of first components 10A so that a second level 11B of second components 10B disposed over the first layer of first components 10A can be adhered to the first layer 11A of first components 10A. In some embodiments, an adhesive layer 24 can be patterned or otherwise coated over component contact pads 19 and connection posts 16 of components 10 in the second level 11B of components 10 make electrical contact with component contact pads 19 in the first layer 11A of components 10 through the adhesive layer 24.

As shown in FIG. 19, in some embodiments, a transfer stamp 30 has a plurality of pillars 32 formed thereon and spatially aligned to components 10 of a component source wafer 60. A transfer stamp 30 can be made of an elastomeric material, such as PDMS. The pillars 32 protrude from and are spatially arranged on the side of the transfer stamp 30 so that each pillar 32 can be aligned with a component 10. The pillars 32 are in contact with the components 10 and are moved in alignment with and towards the destination substrate 20 so that connection posts 16 of the components 10 come in contact with destination substrate contact pads 22 (as shown in FIGS. 20 and 21).

In some embodiments of the present invention, connection posts 16 of components 10 are in contact with, are embedded in, or pierce destination substrate contact pads 22 or component contact pads 19. In some embodiments, either or both of one or more of connection posts 16 and destination substrate contact pads 22 or component contact pads 19 are deformed or crumpled into a non-planar shape or are deformed so that the surfaces of the connection posts 16 and the destination substrate contact pads 22 or component contact pads 19 change shape on contact with each other. Without wishing to be bound by any particular theory, deformation or crumpling can improve the electrical connection between connection posts 16 and destination substrate contact pads 22 or component contact pads 19 by increasing the surface area that is in contact between the connection posts 16 and the destination substrate contact pads 22 or component contact pads 19. To facilitate deformation, in some embodiments, two or more connection posts 16 have a composition softer than that of the destination substrate contact pads 22 or component contact pads 19 or the destination substrate contact pads 22 or component contact pads 19 have a composition softer the two or more connection posts 16.

A connection post 16 can include conductive material such as a solder that is melted to promote the electrical connection between the connection post 16 and a destination contact pad 22 or component contact pad 19. In some embodiments, the destination substrate contact pads 22 or component contact pads 19 include or are coated with a conductive material or solder. Connection posts 16 can contact, be embedded in, or pierce the conductive material. In some embodiments, a destination substrate contact pad 22 or component contact pads 19 has a first conductive layer and a second conductive layer over the first conductive layer, and the second conductive layer has a lower melting temperature than the first conductive layer. With a subsequent heat treatment, the solder can reflow and promote the electrical connection between the connection post 16 and the destination substrate contact pad 22 or component contact pad 19. In some embodiments, both the connection posts 16 and the destination substrate contact pads 22 or component contact pads 19 include a layer of conductive material such as solder or have a layer of conductive material other than the material making up the connection posts 16 or destination substrate contact pads 22 or component contact pads 19 that electrically connects the destination substrate contact pad 22 or component contact pad 19 to the connection post 16. As noted above, a heat treatment can also serve to weld a destination substrate contact pad 22 or component contact pad 19 to a connection post 16. Welding can be facilitated by providing a common material on the surfaces of the connection posts 16 and the destination substrate contact pads 22 or component contact pads 19.

The spatial distribution of components 10 is a matter of design choice for the end product desired. In some embodiments of the present invention, all of the components 10 in a component source wafer 60 array are transferred to the stamp 30 (i.e., in a single step). In some embodiments, a subset of the components 10 in a component source wafer 60 array is transferred in a single step. By varying the number and arrangement of pillars 32 on a transfer stamps 30, the distribution of components 10 on the pillars 32 of the transfer stamp 30 can be likewise varied, as can the distribution of components 10 on a destination substrate 20 or onto a layer of components 10.

In certain embodiments, components 10 are pressed onto or into a destination substrate contact pads 22 or component contact pads 19 by micro-transfer printing with sufficient mechanical pressure against the destination substrate contact pads 22 or component contact pads 19 to drive connection posts 16 into or through a surface of the destination substrate contact pads 22 or component contact pads 19 to form a robust electrical contact between the connection posts 16 of the component 10 and the destination substrate contact pads 22 or component contact pads 19. In some embodiments, a sufficient mechanical pressure is an amount of force needed to cause a destination substrate contact pad 22, component contact pad 19, or connection post 16 to plastically deform as the connection post 16 is pressed into the destination substrate contact pad 22 or component contact pads 19. Thus, in some embodiments, connection posts 16 on an active components 10 may have sharp points and/or a high elastic modulus, for example, by incorporating tungsten. A connection post 16 can have a sharp point, for example, if the top of the post has an area less than 10 microns square, less than 5 microns square, or less than one-micron square. Destination substrate contact pads 22 can also provide adhesion to help adhere components 10 to a destination substrate 20 or to another component 10.

Adhesion between components 10 and the receiving side of a destination substrate 20 or component contact pad 19 should be greater than the adhesion between the components 10 and the pillars 32 of a transfer stamp 30. As such, when the transfer stamp 30 is removed from the receiving side of the destination substrate 20 or component 10, the components 10 adhere more strongly to the destination substrate 20 or component 10 than to the transfer stamp 30, thereby transferring the components 10 from the transfer stamp 30 to the receiving side of the destination substrate 20 or another component 10.

The transfer stamp 30 is then removed leaving the components 10 adhered to the destination substrate 20 or component 10. An optional heat treatment can solder or weld the connection posts 16 of the components 10 to the destination substrate contact pads 22 of the destination substrate 20 or component contact pads 19 of a component 10. Thus, in some embodiments of the present invention, destination substrate contact pads 22, component contact pads 19, or connection posts 16 are heated, causing the destination substrate contact pad 22 metal to reflow and improve adhesion between the components 10 and the destination substrate 20 or component contact pads 19 and improve the electrical connection to the connection posts 16.

In some embodiments of the present invention, a component 10 is a light-emitting component that emits light. In one arrangement, the light is emitted in a direction opposite to the connection posts 16. In some embodiments, a component 10 is covered with a second dielectric layer 15. The second dielectric layer 15 can be transparent to visible light or to the frequencies of light emitted by the light emitter and the light can be emitted through the second dielectric layer 15.

According to some embodiments of the present invention, a component source wafer 60 can be provided with components 10 and component contact pads 19 and connection posts 16 already formed on the component source wafer 60. In some embodiments, an unprocessed component source wafer 60 can be provided with components 10 formed on or in the component source wafer 60. As used herein, an unprocessed component source wafer 60 is a substrate that does not yet include components 10. An unprocessed component source wafer 60 can have other processing steps completed, for example, cleaning, deposition of material layers, or heat or chemical treatments, as are used in the photo-lithographic arts. Components 10 are formed, for example using photo-lithographic processes including forming or providing masks over the component source wafer 60, etching materials, removing masks, and depositing materials. Such processes are used in the photo-lithographic arts. Using such processes, components 10 are formed on or in a component source wafer 60.

Components 10 can be small electronic integrated circuits, for example, having a size of about 5 microns to about 5000 microns in a dimension. Electronic circuits can include semiconductor materials (for example inorganic materials such as silicon or gallium arsenide, or inorganic materials) having various structures, including crystalline, microcrystalline, polycrystalline, or amorphous structures. In some embodiments, components 10 are passive, for example including a conductor that, when used in a printed electronic structure 50 serves to electrically connect one conductor (e.g., a destination substrate contact pad 22 or component contact pad 19) to another, thereby forming an electrical jumper. Components 10 can also include insulating layers and structures such as silicon dioxide, nitride, and passivation layers and conductive layers or structures including wires or electrodes 18 made of aluminum, titanium, silver, or gold that form an electronic circuit. Connection posts 16 or component contact pads 19 can be formed of metals such as aluminum or polysilicon semiconductors deposited and patterned on a component substrate 12. Useable methods and materials for making component 10 electronic circuits are known in the integrated circuit arts. In certain embodiments, large numbers of such small integrated circuits are formed on a single component source wafer 60. Components 10 are typically packed as closely as possible to use the surface area of the component source wafer 60 as efficiently as possible.

In some embodiments, components 10 are small integrated circuits formed in a semiconductor wafer, for example gallium arsenide or silicon, which can have a crystalline structure. Processing technologies for these materials typically employ high heat and reactive chemicals. However, by employing transfer technologies that do not or minimally stress a component 10 or substrate materials, more benign environmental conditions can be used as compared to thin-film manufacturing processes. Thus, in certain embodiments, the present invention has an advantage in that flexible substrates, such as polymeric substrates, that are intolerant of extreme processing conditions (e.g., heat, chemical, or mechanical processes) can be employed for destination substrates 20. Furthermore, without wishing to be bound by any particular theory, it has been demonstrated that crystalline silicon substrates have strong mechanical properties and, in small sizes, can be relatively flexible and tolerant of mechanical stress. This is particularly true for substrates having 5-micron, 10-micron, 20-micron, 50-micron, or even 100-micron thicknesses. In some embodiments, components 10 can be formed in a microcrystalline, polycrystalline, or amorphous semiconductor layer.

In some embodiments, components 10 can be constructed using foundry fabrication processes used in the art. Layers of materials can be used, including materials such as metals, oxides, nitrides and other materials used in the integrated-circuit art. Each component 10 can be a complete semiconductor integrated circuit and can include, for example, transistors. Components 10 can have different sizes, for example, 1000 square microns or 10,000 square microns, 100,000 square microns, or 1 square mm, or larger, and can have variable aspect ratios, for example, 1:1, 2:1, 5:1, or 10:1. Components 10 can be rectangular or can have other shapes.

Certain embodiments of the present invention provide advantages over other printing methods described in the prior art. By employing connection posts 16 on components 10 and a printing method that provides components 10 on a destination substrate 20 or in a component stack, a low-cost method for printing chiplets in large quantities at high density over a destination substrate 20 is provided. Furthermore, additional process steps for electrically connecting the components 10 to the destination substrate 20 are obviated in certain embodiments.

A component source wafer 60 and components 10, stamp 30, and destination substrate 20 can be made separately and at different times or in different temporal orders or locations and provided in various process states.

Methods according to certain embodiments of the present invention can be iteratively applied to a single or multiple destination substrates 20. By repeatedly transferring sub-arrays of components 10 from a transfer stamp 30 to a destination substrate 20 or to layers of components 10 and relatively moving the transfer stamp 30 and destination substrates 20 between stamping operations by a distance equal to the size of a sub-array of the selected components 10 in the transferred sub-array between each transfer of components 10, an array of components 10 formed at a high density on a component source wafer 60 can be transferred to a destination substrate 20 at a much lower density. In practice, a component source wafer 60 is likely to be expensive, and forming components 10 with a high density on the component source wafer 60 will reduce the cost of the components 10, especially as compared to forming components on the destination substrate 20. Transferring components 10 to a lower-density destination substrate 20 can be used, for example, if the components 10 manage elements distributed over the destination substrate 20, for example in a display, digital radiographic plate, or photovoltaic system.

In particular, in some embodiments wherein an active component 10 is an integrated circuit formed in a crystalline semiconductor material, an integrated circuit substrate provides sufficient cohesion, strength, and flexibility that it can adhere to a destination substrate 20 without breaking as the transfer stamp 30 is removed.

In comparison to thin-film manufacturing methods, using densely populated component source wafers 60 and transferring components 10 to a destination substrate 20 that requires only a sparse array of components 10 located thereon does not waste or require active layer material on a destination substrate 20. Methods in accordance with certain embodiments of the present invention can also be used to transfer components 10 made with crystalline semiconductor materials that have higher performance than thin-film active components. Furthermore, flatness, smoothness, chemical stability, and heat stability requirements for a destination substrate 20 used in certain embodiments of the present invention may be reduced because the adhesion and transfer process is not substantially limited by the material properties of the destination substrate 20. Manufacturing and material costs may be reduced because of high utilization rates of more expensive materials (e.g., the source substrate) and reduced material and processing requirements for the destination substrate 20.

For a discussion of micro-transfer printing techniques see U.S. Pat. Nos. 8,722,458, 7,622,367 and 8,506,867. Additional details useful in understanding and performing aspects of the present invention are described in U.S. Patent Application Serial No. U.S. Patent Application Ser. No. 62/148,603 filed Apr. 16, 2015, entitled Micro Assembled Micro LED Displays and Lighting Elements and in U.S. Patent Application Ser. No. 62/055,472 filed Sep. 25, 2014, entitled Compound Micro-Assembly Strategies and Devices, the disclosure of each of which is hereby incorporated herein in its entirety by reference.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain exemplary embodiments thereof, but it will be understood that variations and modifications can be effected within the spirit and scope of the invention.

PARTS LIST

A cross section line
B cross section line
C cross section line
x direction
y direction
10 printed/printable component
10A first component
10B second component
10C third component
11A first level
11B second level
11C third level
12 component substrate
13 circuit contact pads
14 circuit
15 dielectric structure/layer
16 connection post
17 component surface
18 electrode
19 component contact pads
20 destination substrate
22 destination substrate contact pad
24 adhesive layer
30 stamp
32 pillars
50 printed electronic structure
60 printable component source wafer
61 component source wafer substrate
62 sacrificial portion
64 form
66 patterned electrically conductive layer/metal layer
67 tether
67B broken tether
68 anchor
69 gap/empty space
70 printed/printable capacitor
100 provide destination substrate step
110 provide source wafer step
120 provide stamps step
130 micro-transfer print first component onto destination substrate step
140 micro transfer print second component onto first component step
150 micro transfer print second component onto first and third components step

The invention claimed is:

1. A printed electronic structure, comprising at least a first printable electronic component, a second printable electronic component, a third printable electronic component, and a fourth printable electronic component, wherein each of the first printable electronic component, the second printable electronic component, the third printable electronic component, and the fourth printable electronic component comprises:

a component substrate and a circuit disposed in or on the component substrate, one or more connection posts protruding from the component substrate, wherein the one or more connection posts are electrically conductive and each has a peak area smaller than a base area, and one or more electrically conductive exposed component contact pads on or over the component substrate on a side of the component substrate opposite the one or more connection posts, wherein the one or more electrically conductive exposed component contact pads and the one or more connection posts are both electrically connected to the circuit or directly electrically and physically connected to each other, wherein the second printable electronic component comprises three or more connection posts and (i) each of at least one of the three or more connection posts of the second printable electronic component is in physical and electrical contact with a corresponding one of the one or more electrically conductive exposed component contact pads of the first printable electronic component, (ii) each of at least one of the three or more connection posts of the second printable electronic component is in physical and electrical contact with a corresponding one of the one or more electrically conductive exposed component contact pads of the third printable electronic component, and (iii) at least one of the three or more connection posts of the second printable electronic component is in physical and electrical contact with at least one of the one or more electrically conductive exposed component contact pads of the fourth printable electronic component.

2. The printed electronic structure of claim 1, wherein the circuit of any one or more of the first, second, third, and fourth printable electronic components comprises one or more wires, comprises a resistor, comprises a capacitor, comprises one or more transistors, diodes, or light-emitting diodes, or comprises at least one passive element and at least one active element.

3. The printed electronic structure of claim 1, wherein the component substrate of any one or more of the first, second, third, and fourth printable electronic components has a component surface on or over which the circuit is disposed and the one or more connection posts and the one or more electrically conductive exposed component contact pads are unaligned in a direction orthogonal to the component surface.

4. The printed electronic structure of claim 1, wherein the component substrate of any one or more of the first, second, third, and fourth printable electronic components has a component surface on or over which the circuit is disposed and the one or more connection posts and the one or more electrically conductive exposed component contact pads of the any one or more of the first, second, third, and fourth printable electronic components are aligned in a direction orthogonal to the component surface.

5. The printed electronic structure of claim 1, wherein the circuit of any one or more of the first, second, third, and fourth printable electronic components comprises a capacitor.

6. The printed electronic structure of claim 1, comprising a destination substrate comprising one or more destination substrate contact pads and wherein at least one of the one or more connection posts of any one or more of the first, third, and fourth printable electronic components is in physical and electrical contact with at least one of the one or more destination substrate contact pads.

7. The printed electronic structure of claim 1, wherein, for one or more of the first, second, third, and fourth printable electronic components, one or more of the one or more connection posts is directly electrically and physically connected to an electrically conductive exposed component contact pad of the one or more electrically conductive exposed component contact pads.

8. The printed electronic structure of claim 1, wherein the component substrate of any one or more of the first, second, third, and fourth printable electronic components has at least one of a width, a length, and a height from 1 to 2 µm, 2 to 5 µm, 5 to 10 µm, 10 to 20 µm, or 20 to 50 µm.

9. The printed electronic structure of claim 1, wherein each of the one or more connection posts of the second printable electronic component are in electrical and physical contact with a corresponding one of the one or more electrically conductive exposed component contact pads of the first, third, or fourth printable electronic component.

10. The printed electronic structure of claim 1, wherein the second printable electronic component is offset in one or two dimensions from at least one of the first, third, and fourth printable electronic components, so that a portion of the second printable electronic component extends over an edge of the at least one of the first, third, and fourth printable electronic components and a portion of the at least one of the first, third, and fourth printable electronic components is not covered by the second printable electronic component.

11. The printed electronic structure of claim 1, wherein the circuit, the number of electrically conductive exposed component contact pads, the number of connection posts, or materials of the first, third, or fourth printable electronic component is different from those of the second printable electronic component.

12. The printed electronic structure of claim 1, comprising a cured adhesive layer between at least one of the first, third, and fourth printable electronic components and the second printable electronic component that adheres the second printable electronic component to the at least one of the first, third, and fourth printable electronic components.

13. The printed electronic structure of claim 1, comprising a destination substrate comprising one or more destination substrate contact pads and wherein, for each of the first, third, and fourth printable electronic components, at least one of the one or more connection posts is each in electrical and physical contact with a corresponding one of the one or more destination substrate contact pads.

14. The printed electronic structure of claim 1, wherein at least one of the first printable electronic component, the second printable electronic component, the third printable electronic component, and the fourth printable electronic component comprises a broken or separated tether.

15. The printed electronic structure of claim 1, wherein the one or more connection posts of any one or more of the first, second, third, and fourth printable electronic components each comprise an electrically conductive layer coated over a non-conductive material.

16. The printed electronic structure of claim 1, wherein, for one or more of the first, second, third, and fourth printable electronic components, the number of connection posts is different from the number of electrically conductive exposed component contact pads.

17. The printed electronic structure of claim 1, wherein the one or more electrically conductive exposed component contact pads of at least the first printable electronic component and the third printable electronic component are planar.

18. The printed electronic structure of claim 1, wherein at least one of the one or more connection posts of the second printable electronic component is:
  (i) deformed or crumpled, or
  (ii) pierces or is embedded in the corresponding one of the one or more electrically conductive exposed component contact pads of the first, third, or fourth printable electronic component.

19. The printed electronic structure of claim 1, wherein, for one or more of the first, second, third, and fourth printable electronic components, one or more of the one or more electrically conductive exposed component contact pads is disposed at least partially on or over the circuit.

20. The printed electronic structure of claim 1, wherein, for one or more of the first, second, third, and fourth printable electronic components, one or more of the one or more electrically conductive exposed component contact pads is disposed at least partially on a side of the circuit, opposite the one or more connection posts.

21. The printed electronic structure of claim 1, wherein, for one or more of the first, second, third, and fourth printable electronic components, one or more of the one or more electrically conductive exposed component contact pads is disposed at least partially on a side of the component substrate opposite the one or more connection posts.

22. The printed electronic structure of claim 1, wherein, for one or more of the first, second, third, and fourth printable electronic components, the circuit is formed in a semiconductor circuit substrate separate from the component substrate.

23. The printed electronic structure of claim 22, wherein the circuit formed in the semiconductor circuit substrate is an integrated circuit, a chiplet, an electronic structure, or an opto-electronic structure.

* * * * *